(12) United States Patent
Yu et al.

(10) Patent No.: US 6,864,163 B1
(45) Date of Patent: Mar. 8, 2005

(54) FABRICATION OF DUAL WORK-FUNCTION METAL GATE STRUCTURE FOR COMPLEMENTARY FIELD EFFECT TRANSISTORS

(75) Inventors: Allen S. Yu, Fremont, CA (US); James Pan, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 254 days.

(21) Appl. No.: 10/283,523

(22) Filed: Oct. 30, 2002

(51) Int. Cl.[7] .................. H01L 21/3205; H01L 27/4763

(52) U.S. Cl. .................. 438/585; 438/199; 438/587

(58) Field of Search .................. 438/197–199, 438/217, 218, 585, 587, 588, 647, 652

(56) References Cited

U.S. PATENT DOCUMENTS

| | | | | |
|---|---|---|---|---|
| 4,808,261 A | * | 2/1989 | Ghidini et al. | 438/587 |
| 6,130,123 A | * | 10/2000 | Liang et al. | 438/217 |
| 6,444,512 B1 | * | 9/2002 | Madhukar et al. | 438/203 |
| 2004/0080001 A1 | * | 4/2004 | Takeuchi | 257/407 |

* cited by examiner

Primary Examiner—Asok Kumar Sarkar
(74) Attorney, Agent, or Firm—Monica H. Choi

(57) ABSTRACT

For fabricating dual gate structures of complementary field effect transistors, a gate material is deposited into an opening disposed over a P-well and an N-well having the complementary field effect transistors formed therein. A portion of the gate material disposed over one of the P-well or the N-well is modified to form a first gate structure, and the remaining gate material over the other one of the P-well or the N-well forms a second gate structure. The first and second gate structures form the dual gate structures of the complementary field effect transistors.

22 Claims, 18 Drawing Sheets

FABRICATION OF DUAL WORK-FUNCTION METAL GATE STRUCTURE FOR COMPLEMENTARY FIELD EFFECT TRANSISTORS

TECHNICAL FIELD

The present invention relates generally to fabrication of complementary field effect transistors, and more particularly, to a method of fabricating a dual work-function metal gate structure of complementary field effect transistors.

BACKGROUND OF THE INVENTION

Referring to FIG. 1, an inverter 100 includes a pair of complementary MOSFETs (Metal Oxide Semiconductor Field Effect Transistors) including a PMOSFET (P-channel Metal Oxide Semiconductor Field Effect Transistor) 102 and an NMOSFET (N-channel Metal Oxide Semiconductor Field Effect Transistor) 104. The drains of the PMOSFET 102 and the NMOSFFT 104 are coupled together at an output node 106, and the gates of the PMOSFET 102 and the NMOSFET 104 are coupled together at an input node 108. The source of the PMOSFET 102 is coupled to $V_{CC}$ 110, and the source of the NMOSFET 104 is coupled to a ground node 112. Such an inverter 100 of FIG. 1 is known to one of ordinary skill in the art of electronics.

For operation of the inverter 100 of FIG. 1, the threshold voltage across the gate to source of the PMOSFET 102 is typically symmetrical but has an opposite polarity from the threshold voltage across the gate to source of the NMOSFET 104, as known to one of ordinary skill in the art of electronics. For example, the threshold voltage across the gate to source of the PMOSFET 102 may be −0.3 Volts, while the threshold voltage across the gate to source of the NMOSFET 104 may be +0.3 Volts.

FIG. 2 shows a top view of an N-well 114 for fabricating the PMOSFET 102 therein and of a P-well 116 for fabricating the NMOSFET 104 therein. The N-well 114 and the P-well 116 are surrounded by a shallow trench isolation structure 118 comprised of a dielectric material such as silicon dioxide ($SiO_2$) for example. For fabricating the PMOSFET 102 and the NMOSFET 104 of the inverter 100 of FIG. 1, a dummy gate structure 120 is initially formed over the N-well 114 and the P-well 116.

FIG. 3 shows a cross-sectional view across either line I—I in FIG. 2 for the PMOSFET 102 or across line II—II in FIG. 2 for the NMOSFET 104. Assume FIG. 3 shows the cross-sectional view across line II—II in FIG. 2 for the NMOSFET 104. In that case, the P-well 116 is formed on buried oxide 122 which is comprised of silicon dioxide ($SiO_2$) formed on a semiconductor substrate 124 comprised of silicon, in SOI (silicon on insulator) technology. The P-well 116 is comprised of silicon, and the P-well 116 is surrounded by the shallow trench isolation structure 118.

Referring to FIGS. 2 and 3, the dummy gate structure 120 is formed over the P-well 116, and a dummy gate dielectric 126 is formed under the dummy gate structure 120. The dummy gate structure 120 is comprised of polysilicon, and the dummy gate dielectric 126 is comprised of silicon dioxide ($SiO_2$). For the NMOSFET 104, drain and source extension junctions, 128 and 130 respectively, and drain and source contact junctions, 132 and 134 respectively, are formed typically from implantation of N-type dopant into the P-well 116.

Spacers 136 are formed at the sidewalls of the dummy gate structure 120 after formation of the drain and source extension junctions 128 and 130 and before formation of the drain and source contact junctions 132 and 134 for defining such drain and source regions 128, 130, 132, and 134. The drain and source extension junctions 128 and 130 are formed as shallow junctions for minimizing undesired short-channel effects, and the drain and source contact junctions 132 and 134 are formed as deeper junctions for maximizing the volume of silicide to be formed therein for minimizing resistance, as known to one of ordinary skill in the art of integrated circuit fabrication. The drain and source contact junctions 132 and 134 extend down to contact the buried oxide 122 in SOI (semiconductor on insulator) technology for eliminating junction capacitance, as known to one of ordinary skill in the art of integrated circuit fabrication.

Referring to FIG. 4, a drain silicide 142 is formed within the drain contact junction 132 for providing contact to the drain, a source silicide 144 is formed within the source contact junction 134 for providing contact to the source, and a gate silicide 146 is formed with the dummy gate structure 120. Referring to FIG. 5, an ILD (inter-level dielectric) layer 148 typically comprised of low-k dielectric materials is deposited, and the materials on the semiconductor substrate 124 are polished down until the dummy gate structure 120 is exposed. At this point, the cross-sectional view across line I—I in FIG. 2 for the PMOSFET 102 is substantially same as the cross-sectional view across line II—II in FIG. 2 as illustrated in FIG. 5 except that the drain and source extension and contact junctions 128, 130, 132, and 134 would be formed from implantation of P-type dopant into the N-well 114 for the PMOSFET 102.

Referring to FIGS. 2 and 6, FIG. 6 shows the cross-sectional view along line III—III of FIG. 2 including the dummy gate dielectric 126 and the dummy gate structure 120 disposed over the N-well 114 and the P-well 116 after formation of the PMOSFET 102 within the N-well 114 and the NMOSFET 104 within the P-well 116 as illustrated in FIG. 5. Referring to FIGS. 6 and 7, a photo-resist masking material 150 is patterned to remain over the portion of the dummy gate structure 120 disposed over the P-well 116, and the exposed portion of the dummy gate structure 120 and the dummy gate dielectric 126 over the N-well 114 is etched away to form a first gate opening 152.

Referring to FIGS. 7 and 8, a high-k dielectric 154 (i.e., a dielectric material having a dielectric constant higher than that of silicon dioxide ($SiO_2$)) is formed on the N-well 114 at the bottom of the first gate opening 152, and the first gate opening 152 is then filled with a first metal 156. The high-k dielectric 154 on the N-well 114 forms the first gate dielectric and the first metal 156 forms the first metal gate structure of the PMOSFET 102 formed within the N-well 114.

Referring to FIGS. 8 and 9, the remaining portion of the dummy gate structure 120 and the dummy gate dielectric 126 over the P-well 116 is etched away to form a second gate opening 158. Referring to FIGS. 9 and 10, because the sidewalls 157 and 155, respectively, of the first metal gate structure 156 and the first high-k gate dielectric 154 are exposed, the etchant for etching away the dummy gate structure 120 and the dummy gate dielectric 126 over the P-well 116 may etch into the first metal gate structure 156 and the first high-k gate dielectric 154 as illustrated from FIG. 9 to FIG. 10. In addition, a metal oxide 160 may be formed on the exposed sidewall of the first metal gate structure 156.

Referring to FIGS. 10 and 11, a high-k dielectric 162 is deposited on the P-well 116 at the bottom of the second gate opening 158, and the second gate opening 158 is then filled with a second metal 164. The high-k dielectric 162 on the P-well forms the second gate dielectric and the second metal 164 forms the second metal gate structure of the NMOSFET 104 formed within the P-well 116. The first metal gate structure 156 and the second metal gate structure 164 form the dual work-function metal gate structure of the pair of complementary MOSFETs 102 and 104 of FIG. 1. In this manner, the first metal gate structure 156 and the second metal gate structure 164 are comprised of different types of metal such that the complementary MOSFETs 102 and 104 of FIG. 1 have different gates with different work-functions (i.e., dual work-functions) for the symmetrical but opposite threshold voltages.

Processes for forming the structures in the cross-sectional views of FIGS. 3, 4, 5, 6, 7, 8, 9, 10, and 11 in the prior art are known to one of ordinary skill in the art of integrated circuit fabrication. However, referring to FIGS. 1, 10 and 11, in the prior art, formation of the metal oxide 160 on the exposed sidewall of the first metal gate structure 156 results in undesired resistance between the gates of the PMOSFET 102 and NMOSFET 104. Furthermore, etching of the first metal gate 156 and the first gate dielectric 154 toward the N-well results in degradation or even failure of operation of the PMOSFET 102 formed over the N-well 114.

In addition, because the high-k gate dielectrics 154 and 162 are deposited in separate deposition processes in the prior art, the thicknesses of the high-k gate dielectrics 154 and 162 for the PMOSFET 102 and the NMOSFET 104 would vary with processing variations. Such variations of the thicknesses of the high-k gate dielectrics 154 and 162 is undesirable for controlling the threshold voltages of the PMOSFET 102 and the NMOSFET 104. A method is desired for fabricating the dual work-function metal gate structure of the complementary MOSFETs 102 and 104 without such disadvantages of the prior art.

SUMMARY OF THE INVENTION

Accordingly, in a general aspect of the present invention, a dual work-function metal gate structure of complementary MOSFETs are fabricated within an N-well and a P-well by depositing a metal across both the N-well and the P-well and without etching a portion of such a metal.

In one embodiment of the present invention, for fabricating a dual work-function metal gate structure for a pair of complementary field effect transistors, a dummy gate structure is formed to be disposed over a P-well for forming an N-channel field effect transistor and over an N-well for forming a P-channel field effect transistor. The respective drain and source regions for each of the N-channel and P-channel field effect transistors are formed with the dummy gate structure. An inter-level dielectric layer is formed to surround the dummy gate structure with a top surface of the dummy gate structure being exposed. The dummy gate structure is then etched away to form an opening on top of the P-well and the N-well. A layer of gate dielectric material is formed at a bottom of the opening on top of the P-well and the N-well.

In addition, a first metal is deposited into the opening on top of the P-well and the N-well. A layer of dielectric material is deposited and patterned to form a self-aligning mask on the first metal over one of the P-well or the N-well. A second metal is deposited onto the self-aligning mask over one of the P-well or the N-well and onto the first metal exposed over the other of the P-well or the N-well. The second metal is different from the first metal. A thermal anneal is performed such that the first and second metals in contact with each-other inter-diffuse into each-other to form an inter-diffused metal gate over one of the P-well or the N-well. The first metal under the self-aligning mask remains to form a first metal gate over the other one of the P-well or the N-well. The inter-diffused metal gate and the first metal gate form the dual work-function metal gate structure for the pair of complementary field effect transistors.

In another embodiment of the present invention, after the first metal is deposited into the opening, a layer of semiconductor material is deposited and patterned to remain on the first metal over one of the P-well or the N-well. A thermal anneal is performed such that the first metal and the semiconductor material in contact with each-other react to form a metal silicide to form a metal silicide gate over one of the P-well or the N-well. The first metal remains to form a first metal gate over the other one of the P-well or the N-well. The metal silicide gate and the first metal gate form the dual work-function metal gate structure for the pair of complementary field effect transistors.

In a further embodiment of the present invention, after the first metal is deposited into the opening, a layer of implantation masking material is deposited and patterned to remain on the first metal over one of the P-well or the N-well. An ion species is implanted into an exposed portion of the first metal over one of the P-well or the N-well that is not covered with the implantation masking material to form an implanted metal gate over one of the P-well or the N-well. The first metal under the implantation masking material remains to form a first metal gate over the other one of the P-well or the N-well. The implanted metal gate and the first metal gate form the dual work-function metal gate structure for the pair of complementary field effect transistors.

In this manner, the whole dummy gate structure is etched away to form the opening over the N-well and the P-well. The first metal and the gate dielectric are deposited into such an opening and are not etched such that sidewalls of the dual work-function metal gate structure and the gate dielectric are not exposed. Thus, the disadvantageous metal oxide formed on the sidewall of a dual work-function metal gate structure in the prior art is not formed with the present invention.

In addition, the sidewalls of the dual work-function metal gate structure and the gate dielectric are not uncontrollably etched toward one of the P-well or the N-well such that degradation of performance of the complementary field effect transistors is avoided with the present invention. Furthermore, the gate dielectric material which may be a high-k dielectric material for both of the complementary field effect transistors is deposited in one deposition process. Thus, the gate dielectrics for both of the complementary field effect transistors advantageously have a same thickness for better control of the threshold voltage of such field effect transistors.

These and other features and advantages of the present invention will be better understood by considering the following detailed description of the invention which is presented with the attached drawings.

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, and 50 refer to elements having similar structure and function.

DETAILED DESCRIPTION

Figure 1:
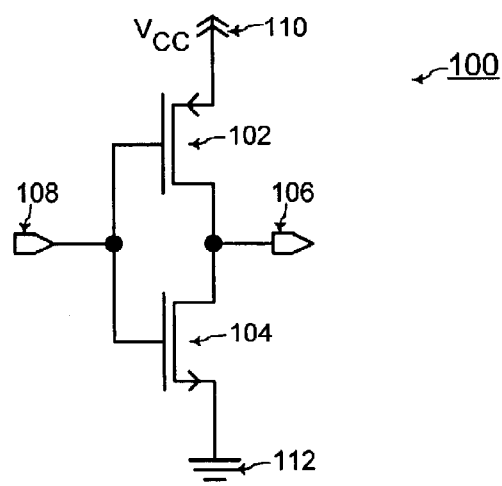
FIG. 1 shows a circuit diagram of an inverter including a pair of complementary field effect transistors, according to the prior art.
Figure 2:
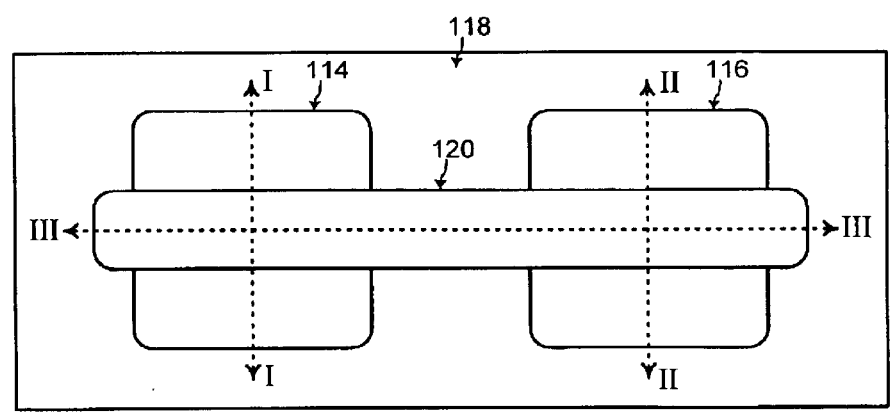
FIG. 2 shows a top view of the complementary transistors of the inverter of FIG. 1 formed with a dummy gate structure, according to the prior art.
Figure 3:
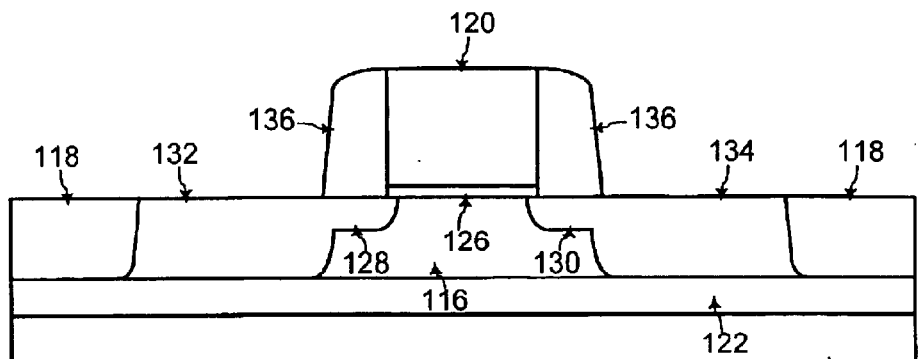
FIGS. 3, 4, and 5 show cross-sectional views for forming drain and source regions with the dummy gate structure of FIG. 2 for one of the complementary transistors of FIGS. 1 and 2, according to the prior art.
Figure 4:
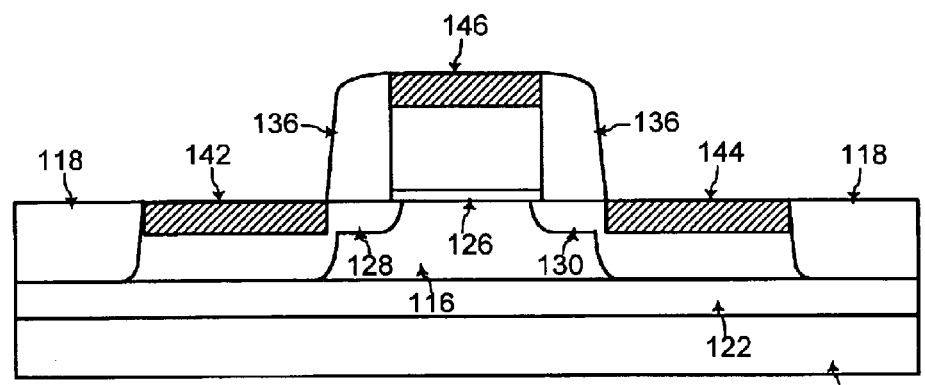
Figure 5:
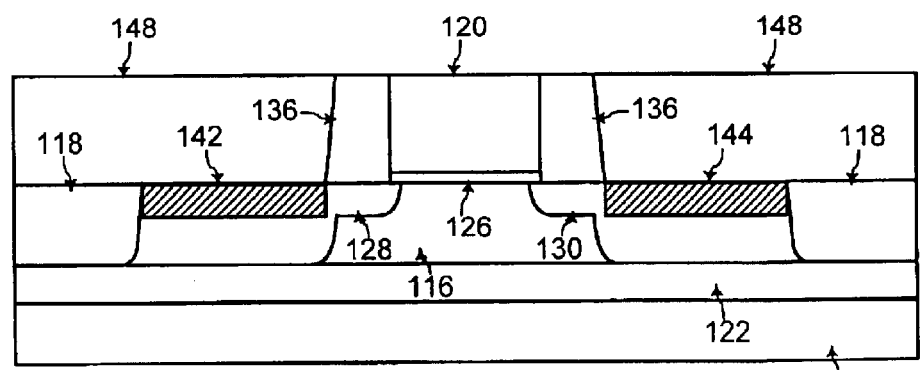
Figure 6:
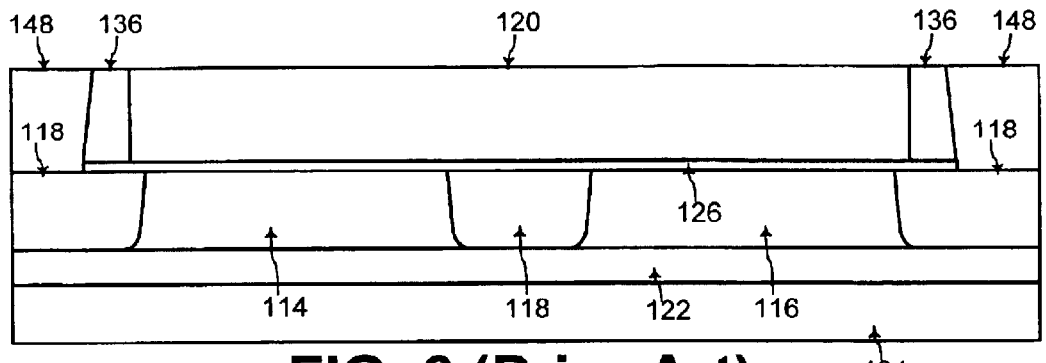
FIGS. 6, 7, 8, 9, 10, and 11 show cross-sectional views for forming the gates comprising the dual work-function metal gate structure of the complementary transistors of FIGS. 1 and 2 after etching away portions of the dummy gate structure, according to the prior art.
Figure 7:
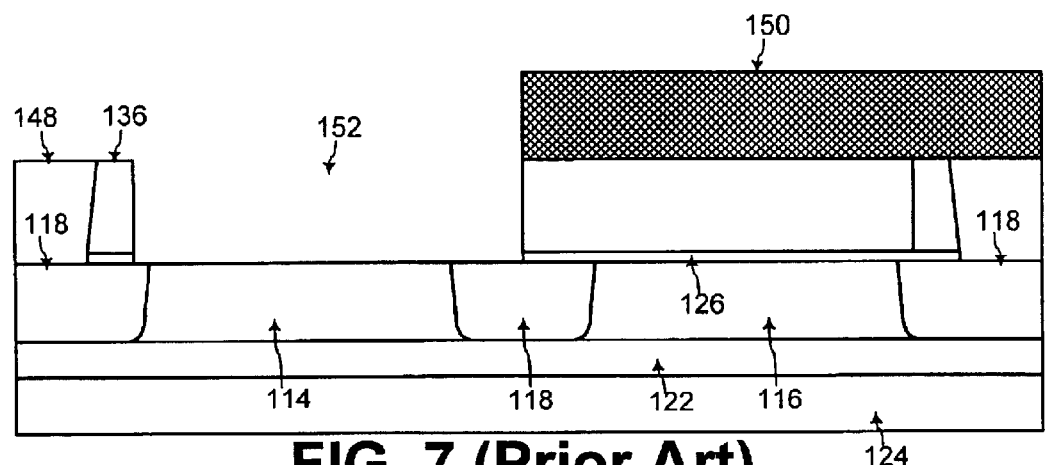
Figure 8:
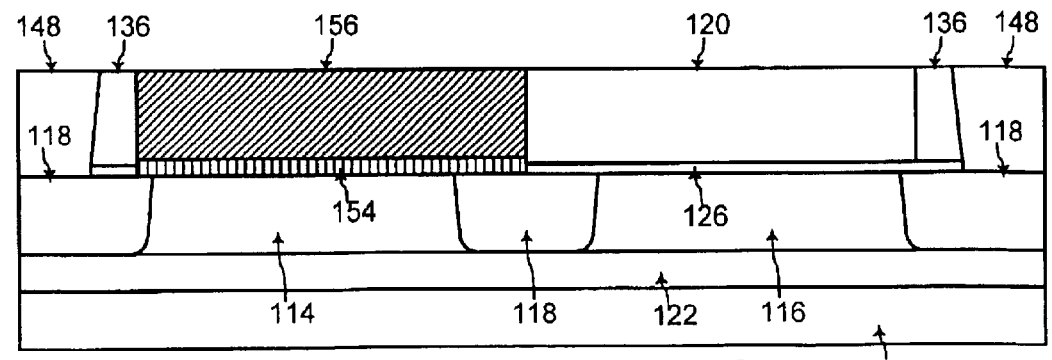
Figure 9:
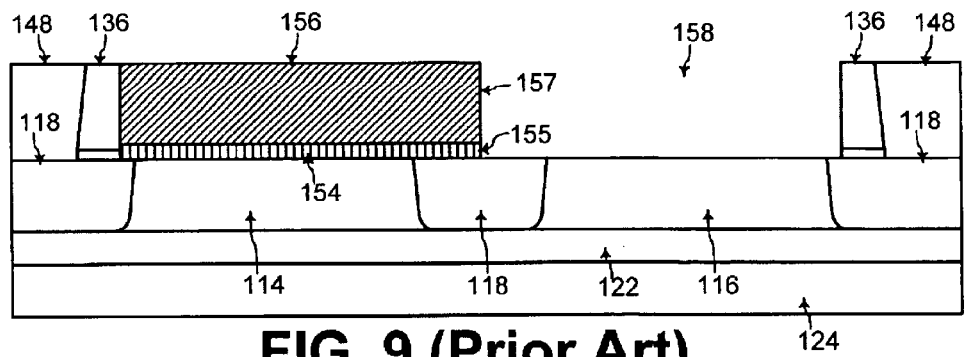
Figure 10:
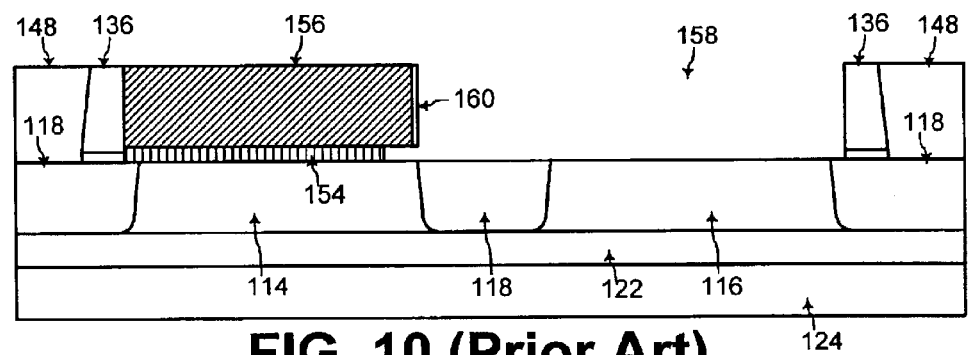
Figure 11:
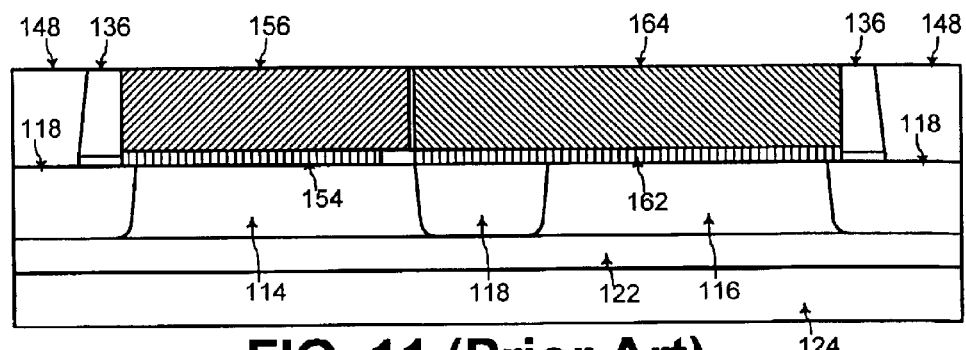
Figure 12:
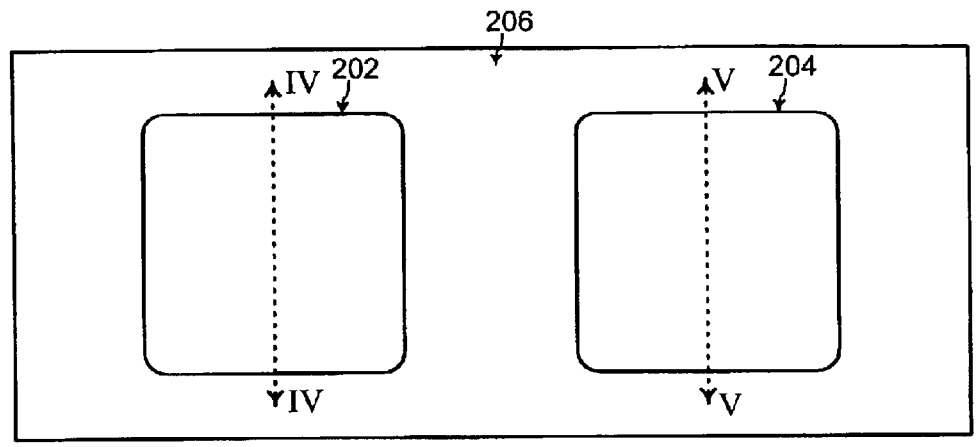
FIG. 12 shows a top view of the N-well and P-well formed for fabrication of the pair of complementary field effect transistors, according to an embodiment of the present invention.

FIG. 12 shows a top view of an N-well 202 for fabricating a PMOSFET (P-channel metal oxide semiconductor field effect transistor) therein and a P-well for fabricating an NMOSFET (N-channel metal oxide semiconductor field effect transistor) therein, as a pair of complementary field effect transistors. The N-well 202 and the P-well 204 are surrounded by a STI (shallow trench insolation) structure 206 for electrically isolating the N-well 202 and the P-well 204. The pair of complementary MOSFETs may be used for formation of the inverter 100 of FIG. 1 for example, but such a pair of complementary MOSFETs fabricated according to the present invention may be used for any other application.

Figure 13:
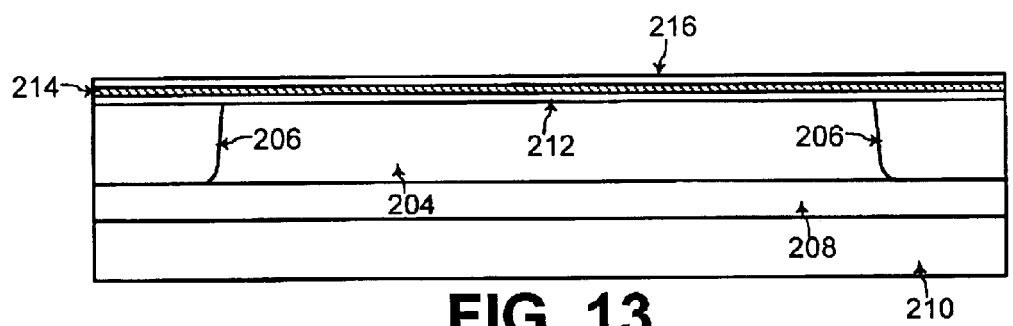
FIGS. 13, 14, 15, 16, 17, 18, and 19 show cross-sectional views for forming drain and source regions along line IV—IV or V—V of FIG. 12 with a dummy gate structure for one of the complementary transistors, according to an embodiment of the present invention.

FIG. 13 shows a cross-sectional view across either line IV—IV in FIG. 12 for the PMOSFET or across line V—V in FIG. 12 for the NMOSFET. Assume FIG. 13 shows the cross-sectional view across line V—V in FIG. 12 for the NMOSFET. In that case, the P-well 204 is formed on a buried oxide 208 which is comprised of silicon dioxide ($SiO_2$) formed on a semiconductor substrate 210 comprised of silicon, according to one embodiment of the present invention in SOI (silicon on insulator) technology. The P-well 204 is comprised of silicon or silicon doped with germanium, and the P-well 204 is surrounded by the shallow trench isolation structure 206 comprised of silicon dioxide ($SiO_2$), according to one embodiment of the present invention. Processes for formation of the buried oxide 208, the P-well 204, and the shallow trench isolation structure 206 individually are known to one of ordinary skill in the art of integrated circuit fabrication.

Figure 14:
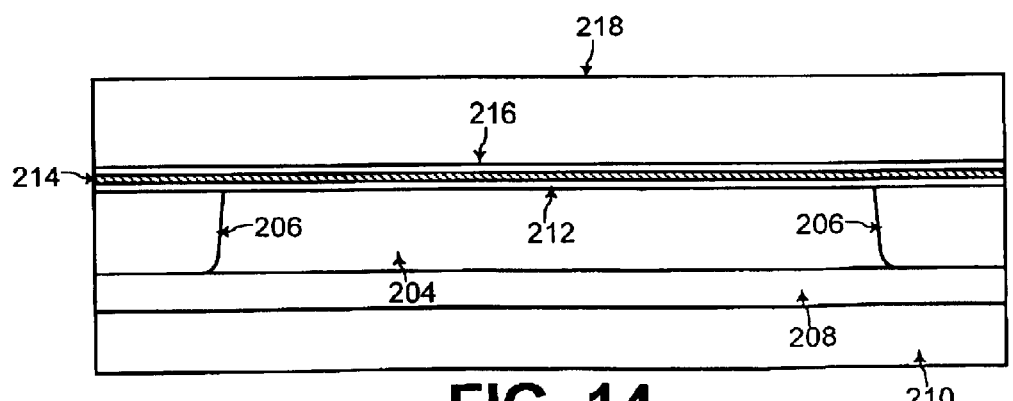

Further referring to FIG. 13, ONO layers are deposited including a first oxide layer 212, a nitride layer 214, and a second oxide layer 216 on the P-well 202 and the N-well 204. Processes for formation of such ONO layers are known to one of ordinary skill in the art of integrated circuit fabrication. Referring to FIGS. 13 and 14, a layer of dummy gate material 218 is deposited on the second oxide layer 216. The dummy gate material 218 is comprised of one of polysilicon, silicon nitride ($Si_xN_y$), silicon oxynitride (SiON), or any other dielectric material known to one of ordinary skill in the art of integrated circuit fabrication, according to one embodiment of the present invention. Processes for depositing such a dummy gate material are known to one of ordinary skill in the art of integrated circuit fabrication.

Figure 15:
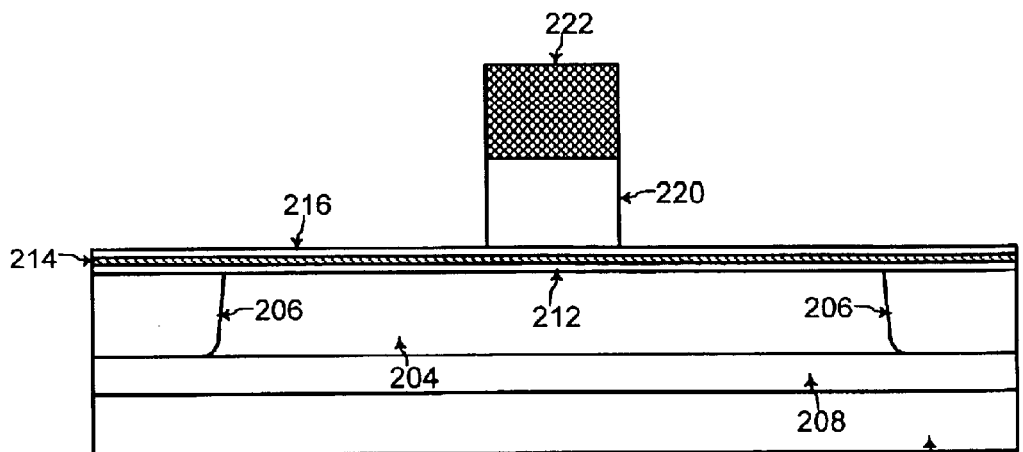

Referring to FIGS. 14 and 15, a gate masking structure 222 is formed over the dummy gate material 218, and any exposed portion of the dummy gate material 218 not under the gate masking structure 222 is etched away to form a dummy gate structure 220. The dummy gate structure 220 is comprised of the dummy gate material 218 remaining under the gate masking structure 222. The gate masking structure 222 is comprised of photo-resist material according to one embodiment of the present invention, and processes for patterning and etching the gate masking structure 222 and the dummy gate material 218 to form the dummy gate structure 220 are known to one of ordinary skill in the art of integrated circuit fabrication.

Figure 16:
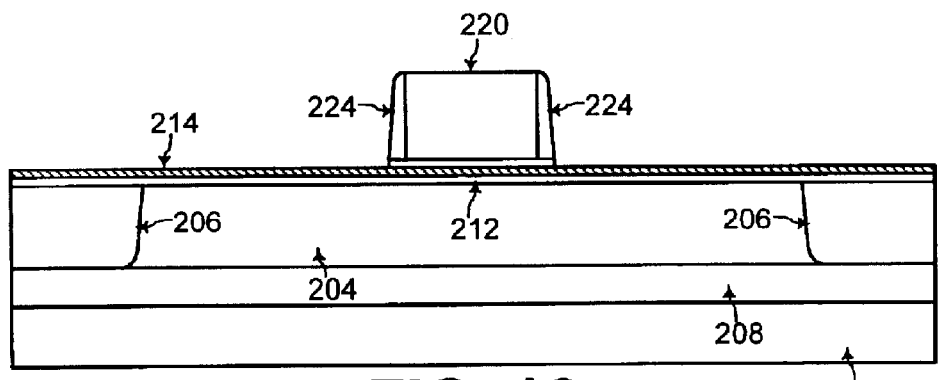

Referring to FIGS. 15 and 16, the gate masking structure 222 is removed after formation of the dummy gate structure 220. Processes for removing such a gate masking structure 222 which may be comprised of photo-resist material for example are known to one of ordinary skill in the art of integrated circuit fabrication. Further referring to FIG. 16, first spacers 224 are formed on the sidewalls of the dummy gate structure 220. The first spacers 224 are comprised of silicon dioxide ($SiO_2$) according to one embodiment of the present invention, and processes for formation of such first spacers 224 are known to one of ordinary skill in the art of integrated circuit fabrication. Any exposed portion of the second oxide layer 216 is etched away during the etching process for forming the first spacers 224 comprised of silicon dioxide (SiO$_2$).

Figure 17:
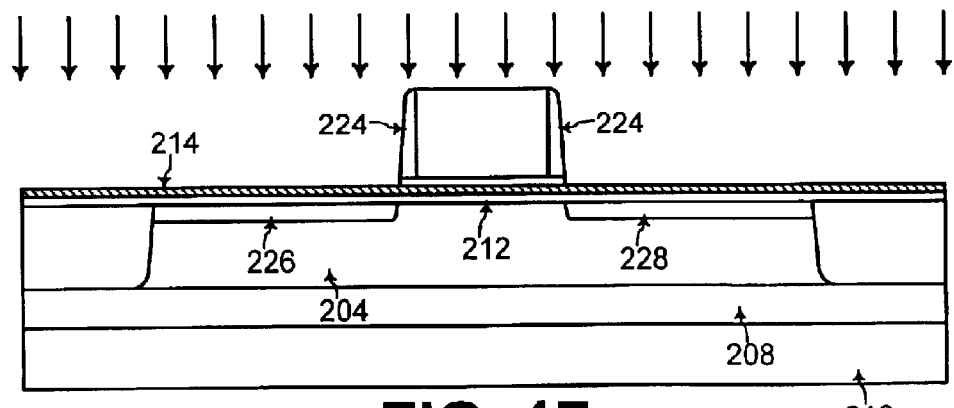

Referring to FIGS. 16 and 17, for fabrication of an NMOSFET, an N-type dopant is implanted into the P-well 204 for forming a drain extension junction 226 and a source extension junction 228. The drain and source extension junctions 226 and 228 are shallow junctions for minimizing undesired short-channel effects of the NMOSFET. The first spacers 224 increase the distance between the drain and source extension junctions 226 and 228 such that the drain and source extension junctions 226 and 228 remain separated from each-other from heating during subsequent processing steps. Such first spacers 224 are especially amenable for maintaining the drain and source extension junctions 226 and 228 to remain separated from each-other as the channel length of the NMOSFET is further scaled down. Implantation processes for formation of the drain and source extension junctions 226 and 228 are known to one of ordinary skill in the art of integrated circuit fabrication.

Figure 18:
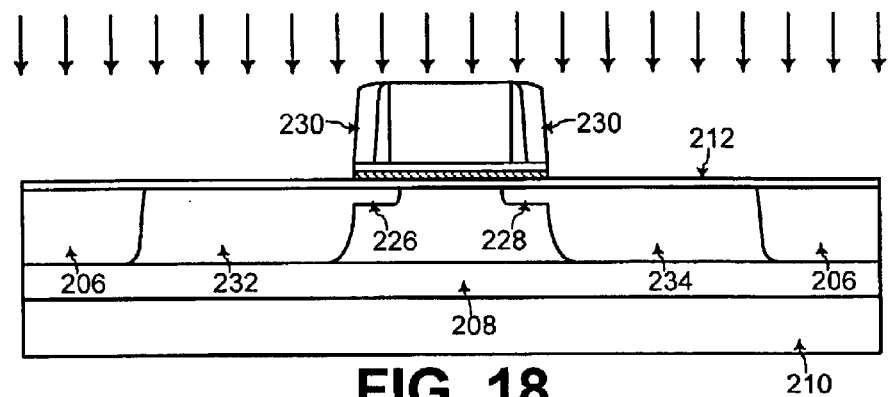

Referring to FIGS. 17 and 18, after formation of the drain and source extension junctions 226 and 228, second spacers 230 are formed on the first spacers 224. The second spacers 230 are comprised of silicon nitride (Si$_3$N$_4$) according to one embodiment of the present invention, and processes for formation of such second spacers 230 are known to one of ordinary skill in the art of integrated circuit fabrication. Any exposed portion of the nitride layer 214 is etched away during the etching process for forming the second spacers 230 comprised of silicon nitride (Si$_3$N$_4$).

After formation of such second spacers 230, an N-type dopant is implanted to form a drain contact junction 232 and a source contact junction 234. The drain and source contact junctions 232 and 234 are formed as deeper junctions for maximizing the volume of silicide to be formed therein for in turn minimizing resistance at the drain and source of the NMOSFET. In addition, the drain and source contact junctions 232 and 234 are formed to contact the buried oxide 208 for eliminating junction capacitance from the drain and source contact junctions 232 and 234. Implantation processes for formation of the drain and source contact junctions 232 and 234 are known to one of ordinary skill in the art of integrated circuit fabrication.

Figure 19:
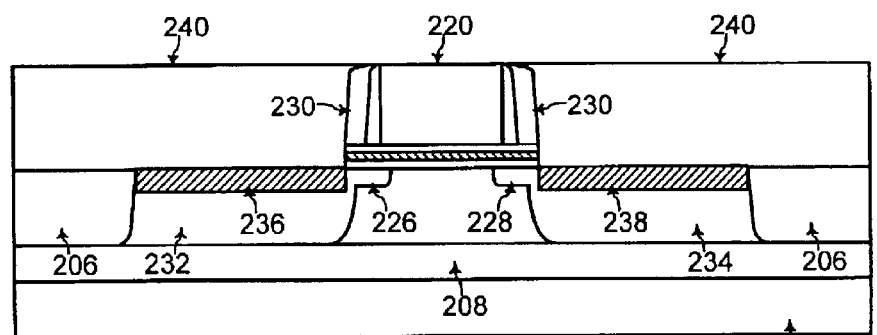

Referring to FIG. 19, any exposed portion of the first oxide layer 212 not under the dummy gate structure 220 is etched away. Processes for etching away any exposed portion of the first oxide layer 212 are known to one of ordinary skill in the art of integrated circuit fabrication. In addition, a drain silicide 236 is formed with the drain contact junction 232 for providing contact to the drain of the NMOSFET, and a source silicide 238 is formed with the source contact junction 234 for providing contact to the source of the NMOSFET. Processes for formation of the drain and source suicides 236 and 238 are known to one of ordinary skill in the art of integrated circuit fabrication.

Further referring to FIG. 19, an ILD (inter-level dielectric) 240 is formed to surround the dummy gate structure 220. After deposition of the ILD (inter-level dielectric) 240, such material on the semiconductor substrate 210 is polished down until the top surface of the dummy gate structure 220 is exposed. The ILD (inter-level dielectric) 240 is comprised of low-k dielectric materials according to one embodiment of the present invention. Processes for depositing and polishing down such an ILD (inter-level dielectric) 240 are known to one of ordinary skill in the art of integrated circuit fabrication.

The cross-sectional view of FIG. 19 is across line V—V in FIG. 12 for the NMOSFET formed within the P-well 204. The cross-sectional view across line IV—IV in FIG. 12 for the PMOSFET would be substantially same as FIG. 19. However, for the PMOSFET, the drain and source extension junctions 226 and 228 and the drain and source contact junctions 232 and 234 are formed from implantation of P-type dopant into the N-well 202, as known to one of ordinary skill in the art of integrated circuit fabrication.

Figure 20:
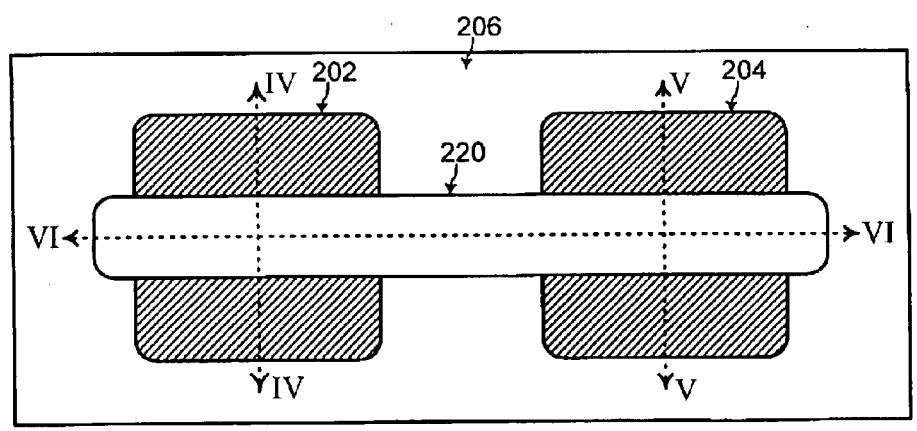
FIG. 20 shows a top view of the dummy gate structure formed over the N-well and P-well, according to an embodiment of the present invention.
Figure 21:
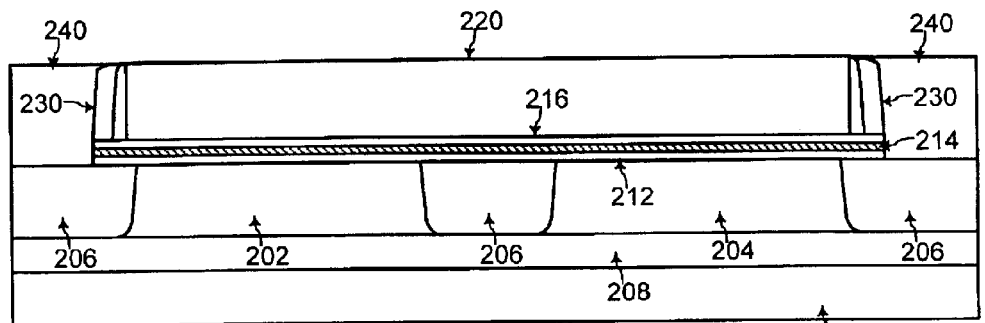
FIGS. 21, 22, 23, 24, 25, 26, 27, 28, 29, and 30 show cross-sectional views for forming the gates comprising the dual work-function metal gate structure of the complementary transistors by inter-diffusion of two metals, according to an embodiment of the present invention.

FIG. 20 shows a top view of the N-well 202 and the P-well 204 after formation of the drain and source junctions and the drain and source silicides for the PMOSFET within the N-well 202 and for the NMOSFET within the P-well 204. The dummy gate structure 220 and the ONO layers 212, 214, and 216 extend across the N-well 202 and the P-well 204. FIG. 21 shows a cross-sectional view of the dummy gate structure 220 across the line VI—VI in FIG. 20 after formation of the ILD (inter-level dielectric) 240 in FIG. 19 and after formation of the portions of the PMOSFET within the N-well 202 and the NMOSFET within the P-well 204 to the point of FIG. 19.

Figure 22:
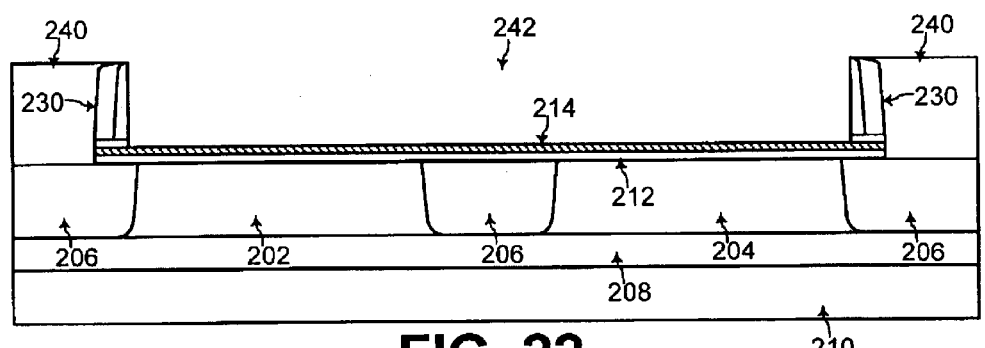

Further referring to FIG. 21, note that the ONO layers 212, 214, and 216 and the dummy gate structure 220 extend over the N-well 202 and the P-well 204. Referring to FIGS. 21 and 22, the dummy gate structure 220 is etched away to form an opening 242. In addition, the second oxide layer 216 at the bottom of the opening 242 is also etched away to expose the nitride layer 214. The dummy gate structure 220 and the second oxide layer 216 may be etched away in separate etching processes with the second oxide layer 216 acting as an etch stop during the etching process for the dummy gate structure 220, according to one embodiment of the present invention. Alternatively, the dummy gate structure 220 and the second oxide layer 216 may be etched away together in one etching process, according to another embodiment of the present invention. Such processes for etching away the dummy gate structure 220 and the second oxide layer 216 are known to one of ordinary skill in the art of integrated circuit fabrication.

Figure 23:
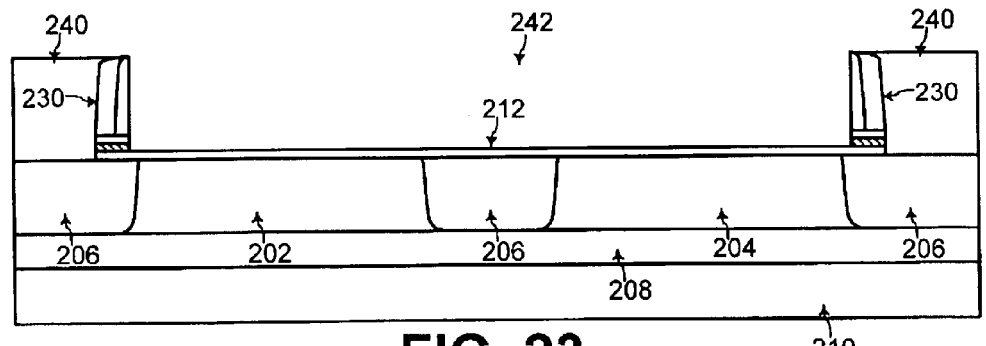
Figure 24:
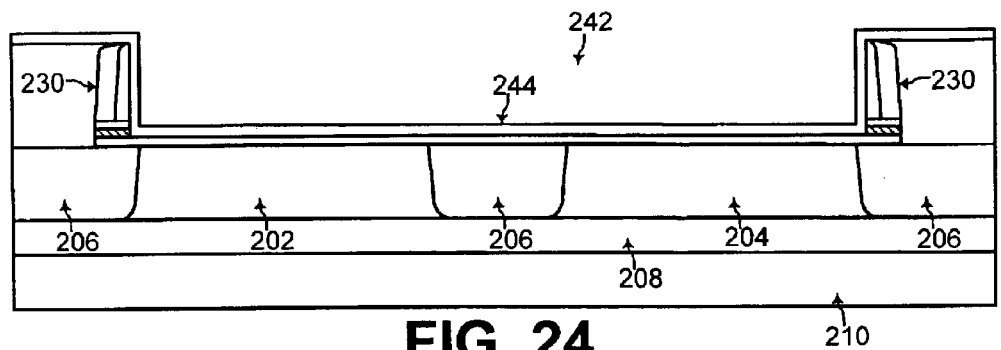

Referring to FIGS. 22 and 23, the nitride layer 214 is etched away in an etching process for selectively etching away the nitride layer 214 while leaving the first oxide layer 212. Such a selective etching process is known to one of ordinary skill in the art of integrated circuit fabrication. Referring to FIGS. 23 and 24, a gate dielectric 244 comprised of a high-k dielectric material (i.e., a dielectric material having a dielectric constant higher than that of silicon dioxide (SiO$_2$)) is deposited on the first layer of oxide 212. The high-k gate dielectric 244 is more stable when deposited onto oxide than onto the semiconductor material of the N-well 202 or P-well 204. Thus, the high-k gate dielectric 244 is deposited onto the first layer of oxide 212, according to one embodiment of the present invention.

The ONO layers 212, 214, and 216 ensure the integrity of the first layer of oxide 212 that is formed to be relatively thin for minimizing the respective threshold voltage of each of the complementary field effect transistors. If just one layer of oxide were formed beneath the dummy gate structure 220 instead of the ONO layers 212, 214, and 216, then the thickness of the remaining layer of oxide before deposition of the high-k gate dielectric 244 would be difficult to control. Rather, with formation of the ONO layers 212, 214, and 216, the nitride layer 214 preserves the integrity of the first layer of oxide 212 during etching away of the dummy gate structure 220 and the second layer of oxide 216.

Then, the nitride layer 214 is selectively etching away leaving the first layer of oxide 212 that is not significantly etched. For example, in one embodiment of the present invention, the first layer of oxide 212 is deposited to a thickness of approximately 5 Å (angstroms) which is two atomic layers in an ALD (atomic layer deposition) process. ALD (atomic layer deposition) processes are known to one of ordinary skill in the art of integrated circuit fabrication. Then, during etching of the nitride layer 214, one atomic layer of the first layer of oxide 212 is etched away leaving approximately 2.5 Å (angstroms) of the first layer of oxide 212 for deposition of the high-k gate dielectric 244 thereon.

Such a minimized thickness of the first layer of oxide 212 is advantageous for minimizing the effective oxide thickness (EOT) of both the first layer of oxide 212 that remains and the high-k gate dielectric 244, for in turn maximizing the drive current of the complementary field effect transistors. The high-k gate dielectric 244 is used because a higher physical thickness may be used with the high-k gate dielectric 244 for an equivalent effective oxide thickness (EOT). The higher physical thickness of the high-k dielectric 244 minimizes charge tunneling and leakage for an equivalent effective oxide thickness (EOT), as known to one of ordinary skill in the art of integrated circuit fabrication.

The high-k gate dielectric 244 is comprised of at least one of hafnium oxide ($HfO_2$), zirconium oxide ($ZrO_2$), aluminum oxide ($AlO_3$), tantalum oxide ($Ta_2O_3$), and titanium oxide (TiO), according to an embodiment of the present invention. For example, the high-k gate dielectric 244 is comprised of just one of such example high-k dielectric materials according to one embodiment of the present invention. In another embodiment of the present invention, the high-k gate dielectric 244 is comprised of a stack of or alternating layers of a plurality of such high-k dielectric materials. Processes for formation of such a high-k gate dielectric 244 are known to one of ordinary skill in the art of integrated circuit fabrication.

Figure 25:
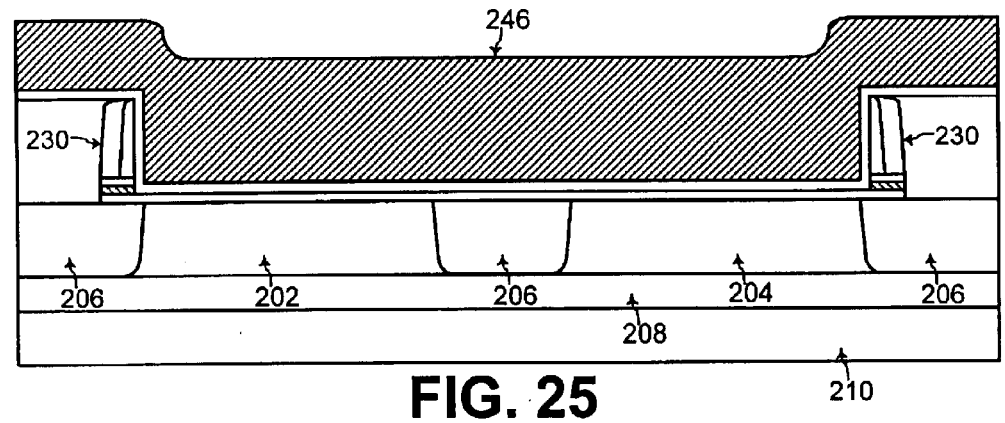

Referring to FIGS. 24 and 25, a first metal 246 is deposited onto the high-k gate dielectric 244 to fill the opening 242. The first metal 246 is comprised of one of tungsten, titanium, tantalum, titanium nitride, tantalum nitride, aluminum, copper, nickel, platinum, and palladium, or a metal alloy of such metals, according to one embodiment of the present invention. Alternatively, the first metal 246 is comprised of a metal nitride or a metal doped with a semiconductor element such as silicon or germanium for example. Processes for depositing such a first metal 246 are known to one of ordinary skill in the art of integrated circuit fabrication.

Figure 26:
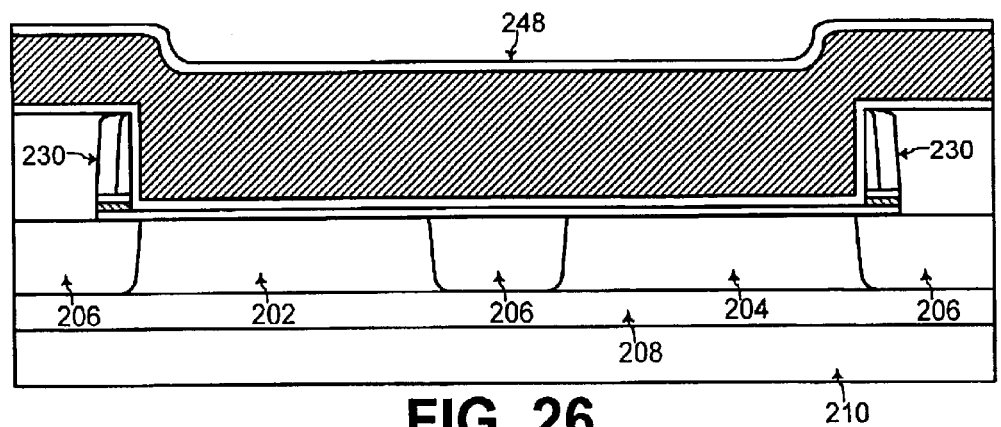

Referring to FIG. 26, a layer of dielectric material 248 is deposited onto the first metal 246. The layer of dielectric material 248 is comprised of silicon nitride ($Si_xN_y$), silicon oxynitride (SiON), silicon dioxide ($SiO_2$), or any other type of dielectric material according to one embodiment of the present invention. Processes for depositing such a layer of dielectric material 248 are known to one of ordinary skill in the art of integrated circuit fabrication.

Figure 27:
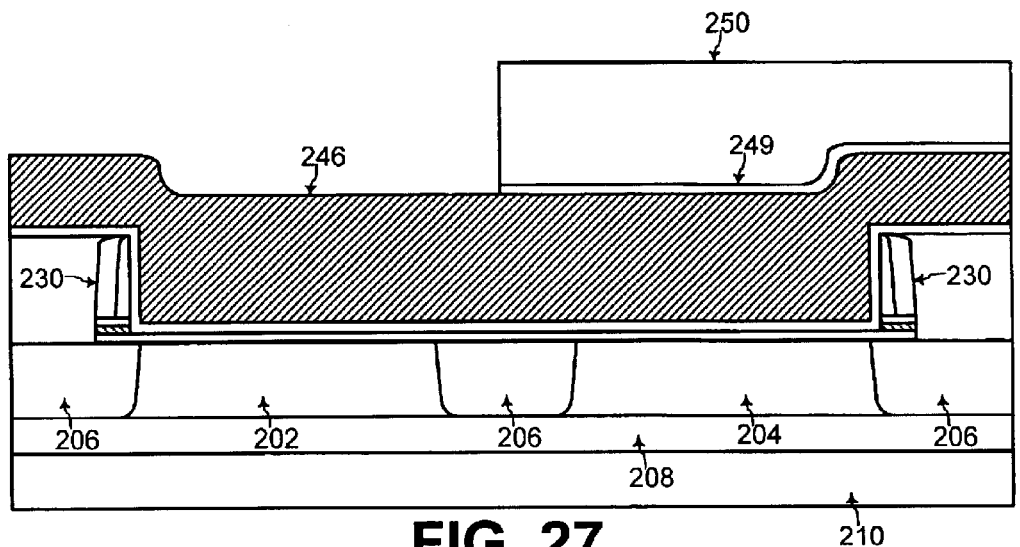

Referring to FIGS. 26 and 27, a masking material 250 is patterned to remain over a portion of the layer of dielectric material 248 disposed over the P-well 204. In addition, any exposed portion of the layer of dielectric material 248 over the N-well 202 is etched away to form a self-aligning mask 249 comprised of the remaining dielectric material 248. The masking material 250 is comprised of photo-resist material according to one embodiment of the present invention. Processes for patterning and etching such a masking material 250 and such a layer of dielectric material 248 to form the self-aligning mask 249 over the P-well 204 but not over the N-well 202 are known to one of ordinary skill in the art of integrated circuit fabrication.

Figure 28:
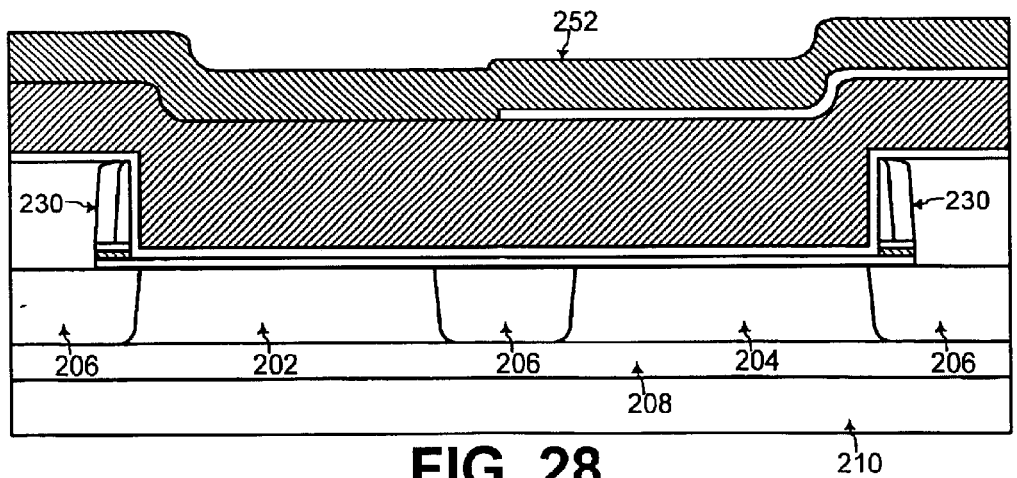

Referring to FIGS. 27 and 28, the masking structure 250 over the self-aligning mask 249 is etched away. Processes for removing the remaining masking structure 250 comprised of photo-resist material for example are known to one of ordinary skill in the art of integrated circuit fabrication. Further referring to FIG. 28, a second metal 252 is then deposited onto the exposed portion of the first metal 246 over the N-well 202 and onto the self-aligning mask 249 over the P-well 204. The second metal 252 is comprised of one of tungsten, titanium, tantalum, titanium nitride, tantalum nitride, aluminum, copper, nickel, platinum, and palladium, or a metal alloy of such metals, according to one embodiment of the present invention. Alternatively, the second metal 252 is comprised of a metal nitride or a metal doped with a semiconductor element such as silicon or germanium for example. Processes for depositing such a second metal 252 are known to one of ordinary skill in the art of integrated circuit fabrication.

Figure 29:
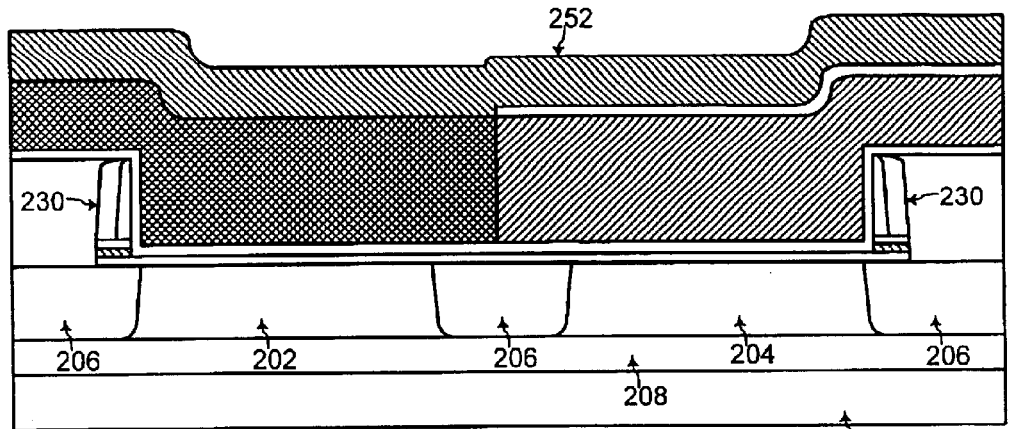

However, according to an embodiment of the present invention, the second metal 252 is different from the first metal 246. Referring to FIGS. 28 and 29, after deposition of the second metal 252, a thermal anneal process is performed at a temperature of about 400° Celsius in one embodiment of the present invention. Thermal anneal processes individually are known to one of ordinary skill in the art of integrated circuit fabrication.

During such a thermal anneal process, the first metal 246 and the second metal 252 in contact with each-other over the N-well 202 inter-diffuse into each other to form an inter-diffused metal material over the N-well 202. On the other hand, the self-aligning mask 249 over the P-well 204 prevents such inter-diffusion in that region such that the first metal 246 and the second metal 252 remain separated from each-other.

Figure 30:
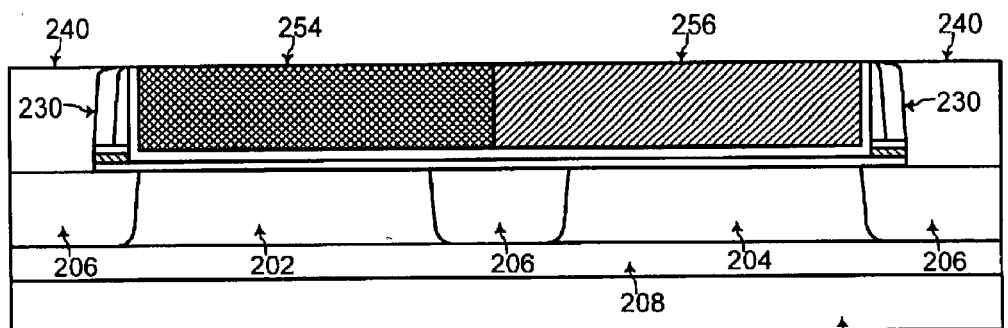

Referring to FIGS. 29 and 30, a polishing process is performed for polishing down the materials on the semiconductor substrate 210 until the inter-diffused metal material forming an inter-diffused metal gate 254 and the first metal 246 forming a first metal gate 256 are contained within the opening 242. Polishing processes, such as CMP (chemical-mechanical-polishing) processes individually are known to one of ordinary skill in the art of integrated circuit fabrication.

Figure 31:
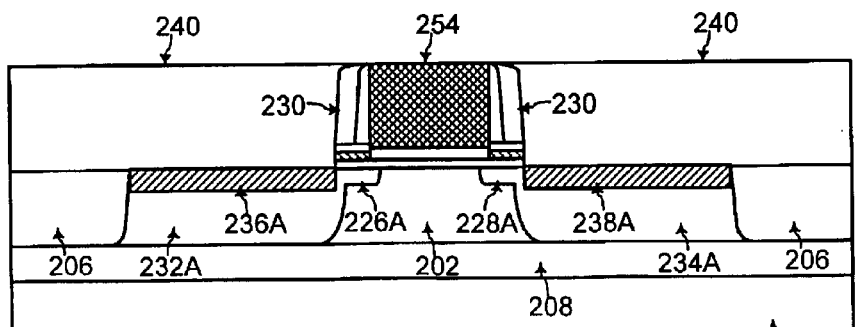
FIG. 31 shows a cross-sectional view along line IV—IV of FIG. 12 after formation of the dual work-function metal gate structure of FIG. 30, according to an embodiment of the present invention.
Figure 32:
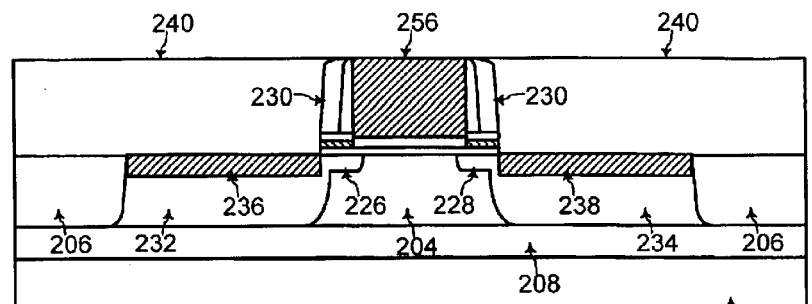
FIG. 32 shows a cross-sectional view along line V—V of FIG. 12 after formation of the dual work-function metal gate structure of FIG. 30, according to an embodiment of the present invention.

Thus, the inter-diffused metal gate 254 and the first metal gate 256 form the dual work-function metal gate structure of the complementary pair of the PMOSFET formed within the N-well 202 and the NMOSFET formed within the P-well 204. FIG. 31 shows a cross-sectional view of the PMOSFET formed along line IV—IV in FIG. 12 with the inter-diffused metal gate 254 forming the gate of such a PMOSFET. The drain and source extension junctions 226A and 228A and the drain and source contact junctions 232A and 243A are formed from implantation of a P-type dopant into the N-well 202 for the PMOSFET. In addition, the drain silicide 236A is formed within the drain contact junction 232A, and the source silicide is formed within the source contact junction 234A. Similarly, FIG. 32 shows a cross-sectional view of the NMOSFET formed along line V—V in FIG. 12 with the first metal gate 256 forming the gate of such an NMOSFET.

In this manner, the whole dummy gate structure 220 is etched away in FIG. 22 to form the opening 242 over the N-well 202 and the P-well 204. The first metal 246 and the gate dielectric 244 are deposited into such an opening 242 and are not etched such that sidewalls of the dual work-function metal gate structure and the gate dielectric are not exposed. Thus, the disadvantageous metal oxide formed on the sidewall of a dual work-function metal gate structure in the prior art is not formed with the present invention.

In addition, the sidewalls of the dual work-function metal gate structure and the gate dielectric are not uncontrollably etched toward one of the N-well or the P-well such that degradation of performance of the complementary field effect transistors is avoided with the present invention. Furthermore, the high-k dielectric material forming the gate dielectric for both of the complementary field effect transistors is deposited in one deposition process. Thus, the gate dielectrics for both of the complementary field effect transistors advantageously have a same thickness for better control of the threshold voltage of such field effect transistors.

Figure 33:
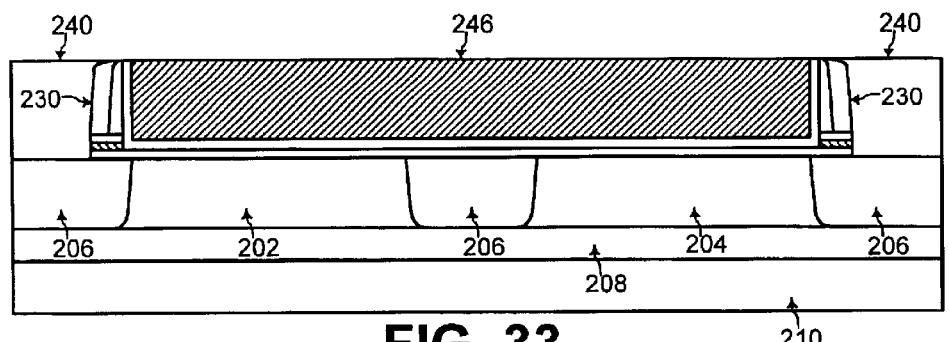
FIGS. 33, 34, 35, and 36 show cross-sectional views for forming the gates comprising the dual work-function metal gate structure of the complementary transistors by inter-diffusion of two metals after polishing of a first deposited metal, according to another embodiment of the present invention.
Figure 34:
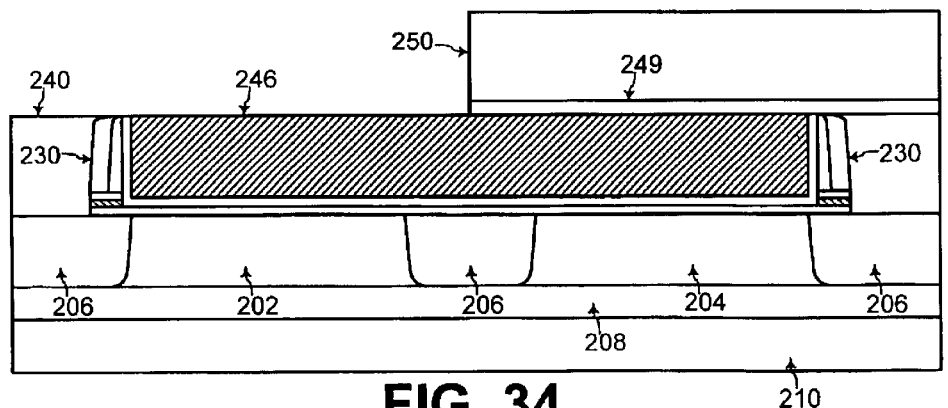

FIGS. 33, 34, 35, and 36 show cross-sectional views along line VI—VI of FIG. 20 for forming the dual work-function metal gate structure of the complementary field effect transistors according to another embodiment of the present invention. Referring to FIGS. 25 and 33, after the first metal 246 is deposited to fill the opening 242 in FIG. 25, the first metal 246 is polished down to be contained within the opening 242 in FIG. 33. Referring to FIGS. 33 and 34, the layer of dielectric material 248 is then deposited and patterned to form the self-aligning mask 249 over the P-well 204 with the masking material 250 similarly as already described herein with respect to FIGS. 26 and 27. The flatter polished surface of the first metal 246 in this embodiment enhances the photo-lithography process for patterning the layer of dielectric material 248 with the masking material 250 comprised of photo-resist in this embodiment of the present invention.

Figure 35:
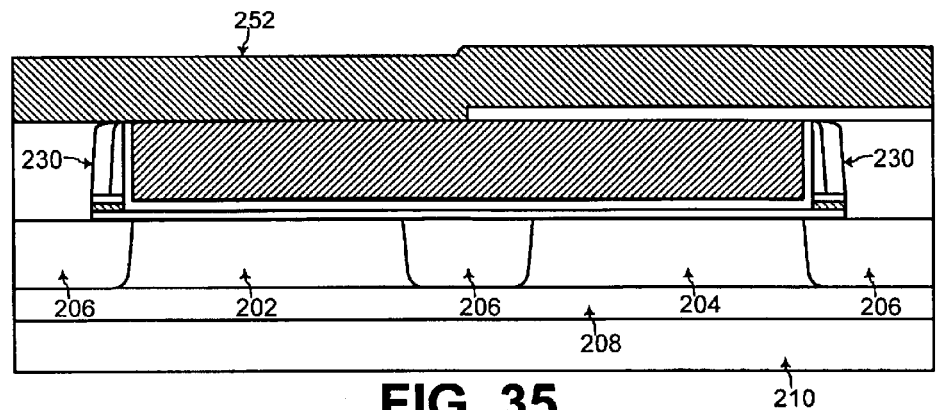
Figure 36:
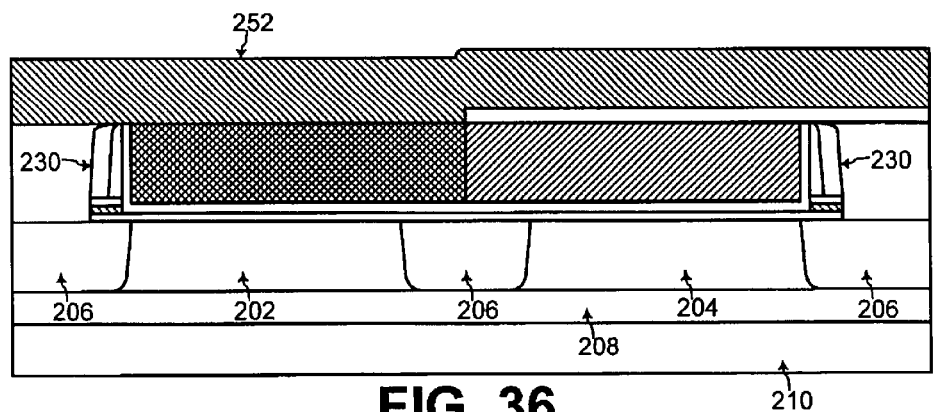

Referring to FIGS. 34 and 35, the masking material 250 is removed, and the second metal 252 is deposited onto the exposed portion of the first metal 246 over the N-well 202 and over the self-aligning mask 249 over the P-well 204, similarly as already described herein with respect to FIG. 28. Referring to FIGS. 35 and 36, a thermal anneal is then performed at a temperature of about 400° Celsius such that the first metal 246 and the second metal 254 in contact with each-other over the N-well 202 inter-diffuse into each other to form an inter-diffused metal material over the N-well 202, as already described herein with respect to FIG. 29.

On the other hand, the self-aligning mask 249 over the P-well 204 prevents such inter-diffusion in that region such that the first metal 246 and the second metal 254 remain separated from each-other, as already described herein with respect to FIG. 29. Referring to FIGS. 36 and 30, a polishing process may then be performed after FIG. 36 for polishing down the materials on the semiconductor substrate 210 until the inter-diffused metal material forming the inter-diffused metal gate 254 and the first metal 246 forming the first metal gate 256 are contained within the opening 242 as illustrated in FIG. 30.

Figure 37:
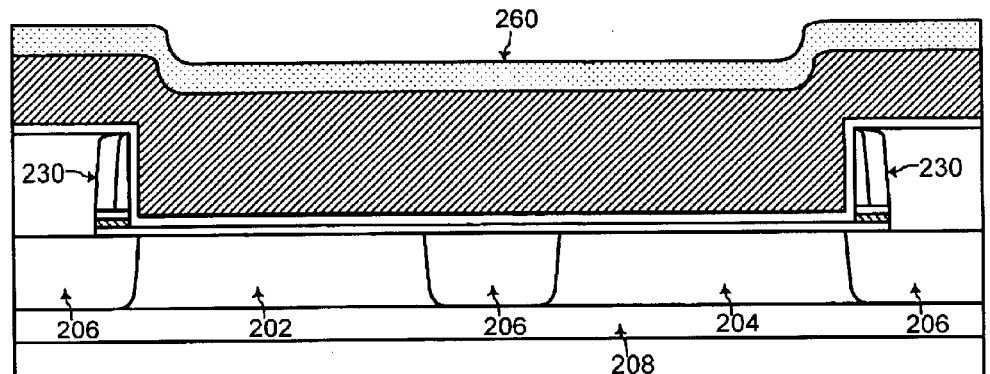
FIGS. 37, 38, 39, and 40 show cross-sectional views for forming the gates comprising the dual work-function metal gate structure of the complementary transistors by formation of a metal silicide, according to another embodiment of the present invention.

FIGS. 37, 38, 39, and 40 show cross-sectional views along line VI—VI of FIG. 20 for forming the dual work-function metal gate structure of the complementary field effect transistors according to a further embodiment of the present invention. Referring to FIGS. 25 and 37, after the first metal 246 is deposited to fill the opening 242 in FIG. 25, a layer of semiconductor material 260 is deposited onto the first metal 246 in FIG. 37. In one embodiment of the present invention, the layer of semiconductor material 260 is comprised of amorphous silicon. Amorphous silicon may be deposited advantageously at a lower temperature than poly-silicon to prevent diffusion of dopant within the drain and source extension junctions of the complementary field effect transistors. Processes for deposition of amorphous silicon 260 are known to one of ordinary skill in the art of integrated circuit fabrication.

Figure 38:
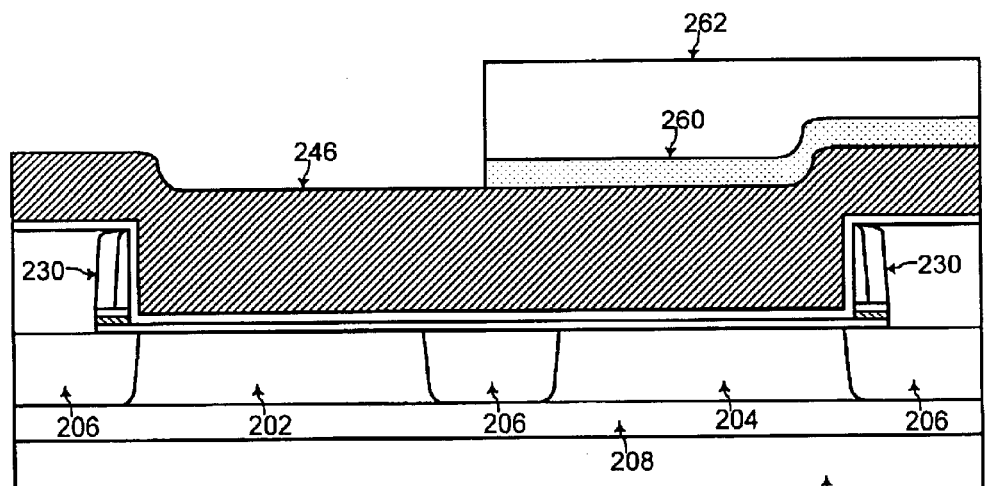

Referring to FIGS. 37 and 38, a masking material 262 is patterned to remain over the P-well 204. The masking material 262 is comprised of photo-resist material according to one embodiment of the present invention, and processes for depositing and patterning such masking material 262 are known to one of ordinary skill in the art of integrated circuit fabrication. Further referring to FIG. 38, the exposed portion of the amorphous silicon 260 over the N-well 202 is etched away while the amorphous silicon 260 under the masking material 262 over the P-well 204 remains. Processes for etching away the exposed portion of the amorphous silicon 260 are known to one of ordinary skill in the art of integrated circuit fabrication.

Figure 39:
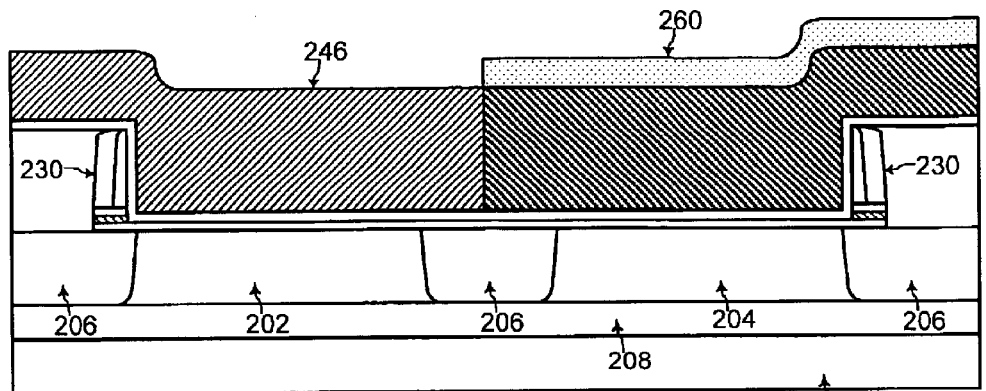

Referring to FIGS. 38 and 39, the masking material 262 is removed. The masking material 262 is comprised of photoresist material according to one embodiment of the present invention, and processes for removing such a masking material 262 are known to one of ordinary skill in the art of integrated circuit fabrication. Further referring to FIG. 39, after removal of the masking material 262, a thermal anneal is performed such that the portions of the first metal 246 and the amorphous silicon 260 in contact with each other react to form a metal silicide over the P-well 204. On the other hand, the first metal 246 remains substantially unchanged over the N-well 202.

Figure 40:
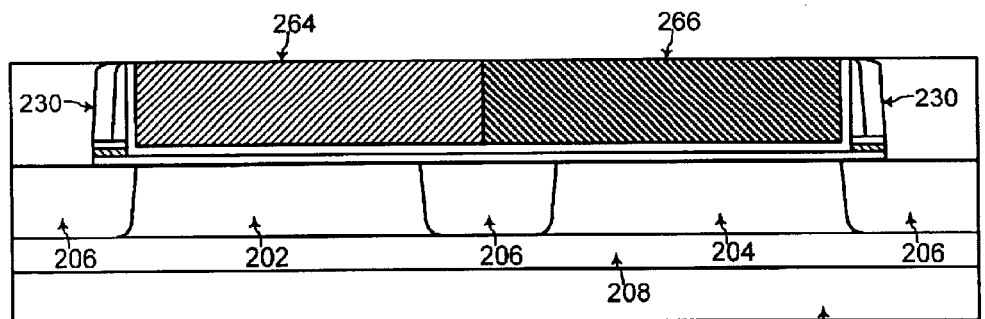

Referring to FIGS. 39 and 40, a polishing process is performed for polishing down the materials on the semiconductor substrate 210 until the metal silicide forming a metal silicide gate 266 and the first metal 246 forming a first metal gate 264 are contained within the opening 242 in FIG. 40. Polishing processes, such as CMP (chemical-mechanical-polishing) processes individually are known to one of ordinary skill in the art of integrated circuit fabrication.

Thus, the metal silicide gate 266 and the first metal gate 264 form the dual work-function metal gate structure of the complementary pair of the PMOSFET formed within the N-well 202 and the NMOSFET formed within the P-well 204. The first metal gate 264 forms the gate of the PMOSFET formed within the N-well 202, and the metal silicide gate 266 forms the gate of the NMOSFET formed within the P-well 204.

Figure 41:
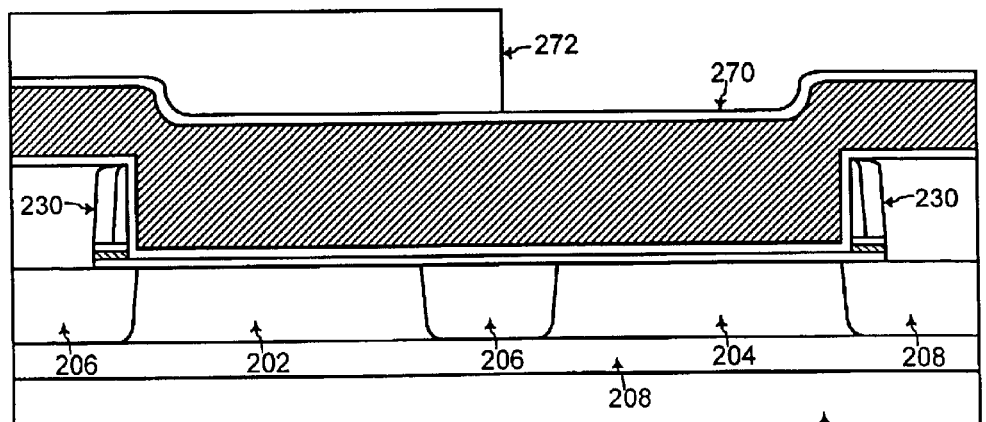
FIGS. 41, 42, 43, and 44 show cross-sectional views for forming the gates comprising the dual work-function metal gate structure of the complementary transistors by ion implantation, according to another embodiment of the present invention.
Figure 42:
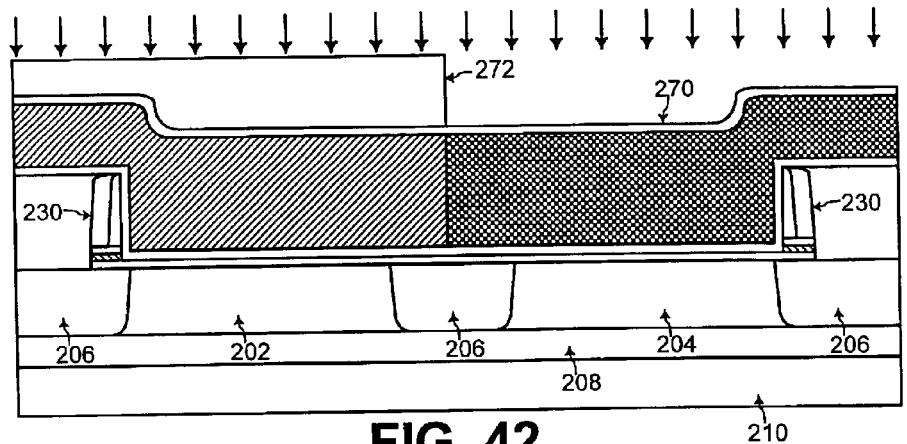
Figure 43:
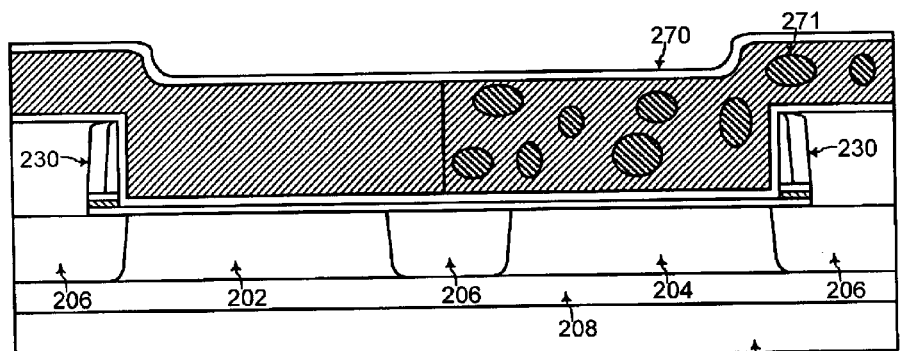

FIGS. 41, 42, and 43 show cross-sectional views along line VI—VI of FIG. 20 for forming the dual work-function metal gate structure of the complementary field effect transistors according to yet another embodiment of the present invention. Referring to FIGS. 25, and 41, after the first metal 246 is deposited to fill the opening 242 in FIG. 25, a layer of dielectric material 270 is deposited onto the first metal 246. The layer of dielectric material 270 is comprised of silicon dioxide ($SiO_2$), silicon nitride ($Si_xN_y$), silicon oxynitride (SiON), or any other dielectric, according to one embodiment of the present invention. Processes for depositing such a layer of dielectric material 270 are known to one of ordinary skill in the art of integrated circuit fabrication.

Further referring to FIG. 41, an implantation masking material 272 is deposited and patterned to cover a portion of the layer of dielectric material 270 over the N-well 202. Referring to FIGS. 41, and 42, an implantation process is performed for implanting an ion species into the portion of the first metal 246 not under the implantation masking material 272. The implantation masking material 272 prevents implantation of the ion species into the covered portion of the first metal 246 over the N-well 202, and such an implantation masking material 272 is known to one of ordinary skill in the art of integrated circuit fabrication. In addition, the layer of dielectric material 270 on the first metal 246 prevents sputtering of the first metal 246 into the implantation chamber.

In one embodiment of the present invention, the ion species implanted into the portion of the first metal 246 not under the implantation masking material 272 is comprised of one of xenon, nitrogen, silicon, or germanium. Implantation processes for implanting such ion species are known to one of ordinary skill in the art of integrated circuit fabrication. Referring to FIGS. 42 and 43, after such an implantation process, the implantation masking material 272 is removed, and processes for removing the implantation masking material 272 are known to one of ordinary skill in the art of integrated circuit fabrication. The portion of the first metal 246 not under the implantation masking material 272 having the ion species implanted therein forms an implanted metal gate over the P-well 204 for the NMOSFET fabricated within the P-well 204. The portion of the first metal 246 over the N-well 204 is substantially not changed and forms the first metal gate over the N-well 202 for the PMOSFET fabricated within the N-well 202.

Figure 44:
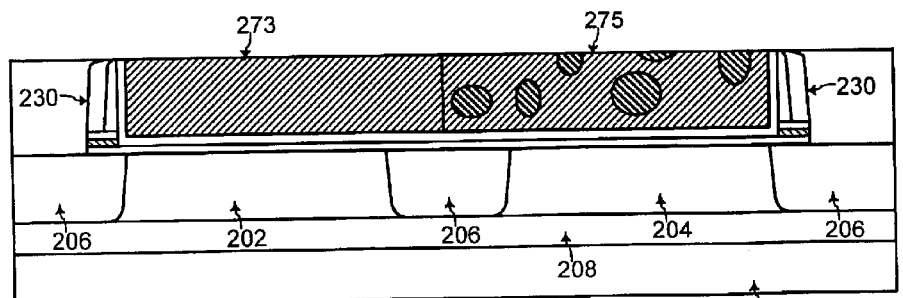

Further referring to FIG. 43, when the ion species implanted into the portion of the first metal 246 not under the implantation masking material 272 over the P-well 204 is comprised of one of silicon or germanium, a thermal anneal process is performed such that the silicon or germanium implanted into that portion of the first metal 246 reacts with the first metal to form metal silicide regions 271 within the implanted metal gate over the P-well 204. Referring to FIGS. 43 and 44, the materials on the semiconductor substrate 210 may then be polished down to form the first metal gate 273 comprised of the first metal 246 and the implanted metal gate 275 comprised of the first metal 246 with the metal silicide regions 271 (i.e., a partial metal silicide). The first metal gate 273 and the implanted metal gate 275 form the dual work-function metal gate structure of the complementary pair of the PMOSFET formed within the N-well 202 and the NMOSFET formed within the P-well 204.

Also, note that in the embodiment of 37, the first metal 246 may be polished as illustrated in FIG. 33 before the layer of amorphous silicon 260 is deposited thereon. Similarly, in the embodiment of FIG. 41, the first metal 246 may be polished as illustrated in FIG. 33 before the layer of dielectric 270 is deposited thereon.

In this manner, in any of the above-described alternative embodiments also, the whole dummy gate structure 220 is etched away in FIG. 22 to form the opening 242 over the N-well 202 and the P-well 204. The first metal 246 and the gate dielectric 244 are deposited into such an opening 242 and are not etched such that sidewalls of the dual work-function metal gate structure and the gate dielectric are not exposed. Thus, the disadvantageous metal oxide formed on the sidewall of a dual work-function metal gate structure in the prior art is not formed with the present invention.

In addition, the sidewalls of the dual work-function metal gate structure and the gate dielectric are not uncontrollably etched toward one of the N-well or the P-well such that degradation of performance of the complementary field effect transistors is avoided with the present invention. Furthermore, the high-k dielectric material forming the gate dielectric for both of the complementary field effect transistors is deposited in one deposition process. Thus, the gate dielectrics for both of the complementary field effect transistors advantageously have a same thickness for better control of the threshold voltage of such field effect transistors.

Figure 45:
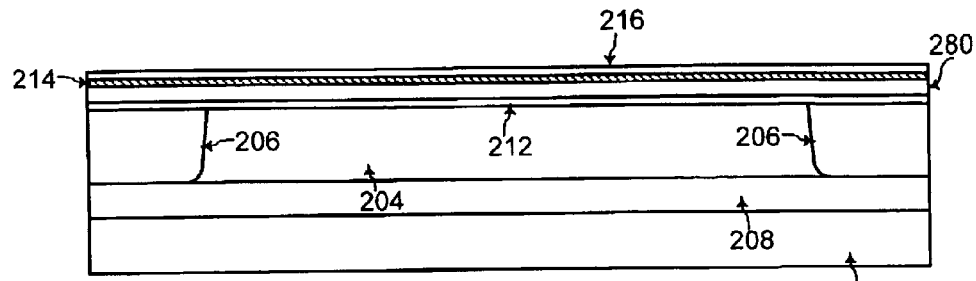
FIGS. 45, 46, 47, 48, 49, and 50 show cross-sectional views for forming the gates comprising the dual work-function metal gate structure of the complementary transistors but with the gate dielectric material already deposited with the ONO (oxide nitride oxide) layers, according to yet another embodiment of the present invention.

FIGS. 45, 46, 47, 48, 49, and 50 show cross-sectional views for forming the dual work-function metal gate structure of the complementary field effect transistors according to yet another embodiment of the present invention. FIG. 45 is substantially similar to FIG. 13, but in FIG. 45, a layer of high-k gate dielectric material 280 is deposited between the first oxide layer 212 and the nitride layer 214 during deposition of the ONO layers 212, 214, and 216.

The high-k gate dielectric material 280 is comprised of at least one of hafnium oxide ($HfO_2$), zirconium oxide ($ZrO_2$), aluminum oxide ($AlO_3$), tantalum oxide ($Ta_2O_3$), and titanium oxide (TiO), according to an embodiment of the present invention. For example, the high-k gate dielectric material 280 is comprised of just one of such example high-k dielectric materials according to one embodiment of the present invention. In another embodiment of the present invention, the high-k gate dielectric material 280 is comprised of a stack of or alternating layers of a plurality of such high-k dielectric materials. Processes for formation of such a high-k gate dielectric material 280 between the first oxide layer 212 and the nitride layer 214 are known to one of ordinary skill in the art of integrated circuit fabrication.

Figure 46:
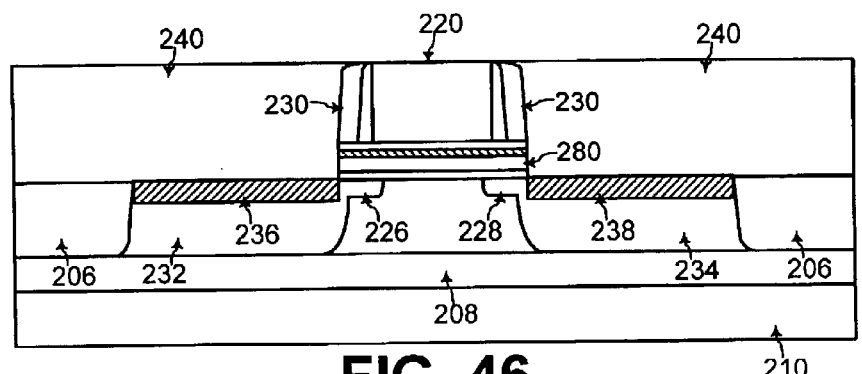
Figure 47:
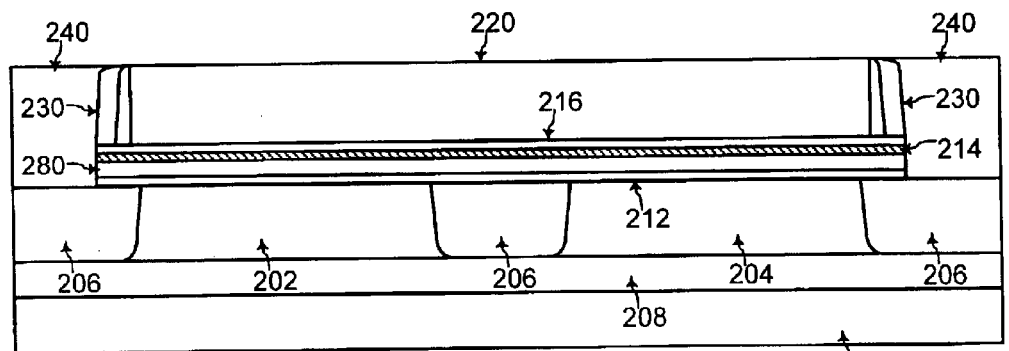

Referring to FIGS. 46 and 19, the complementary field effect transistors are formed with the high-k gate dielectric material 280 between the first oxide layer 212 and the nitride layer 214. Thus, FIG. 46 is substantially similar to FIG. 19, but in FIG. 46, the high-k gate dielectric material 280 is between the first oxide layer 212 and the nitride layer 214. Similarly, FIG. 47 is substantially similar to FIG. 21, but in FIG. 47, the high-k gate dielectric material 280 is between the first oxide layer 212 and the nitride layer 214.

Figure 48:
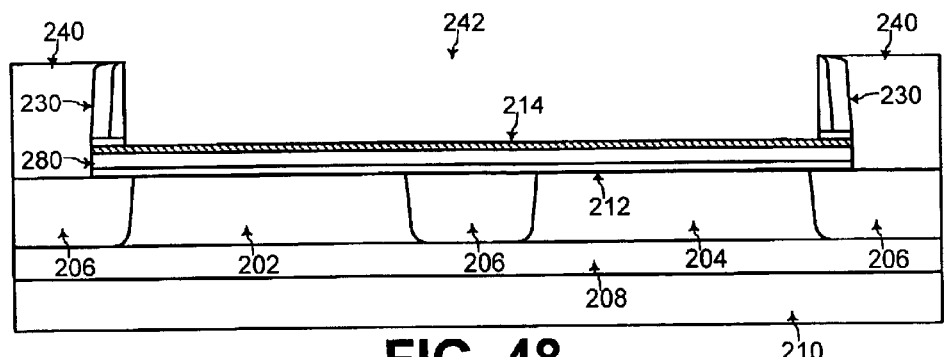
Figure 49:
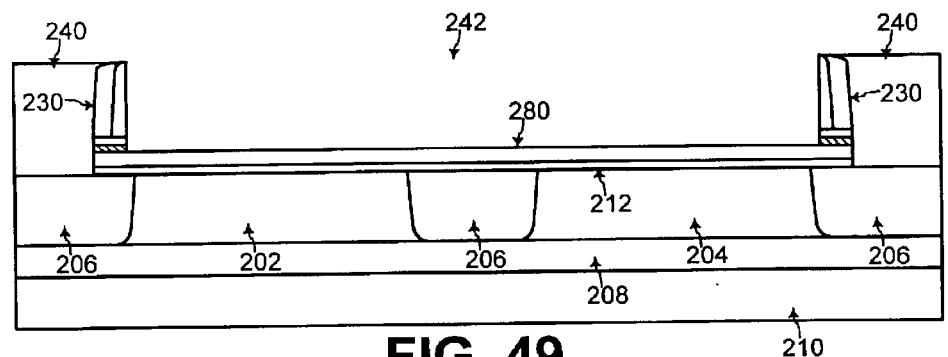
Figure 50:
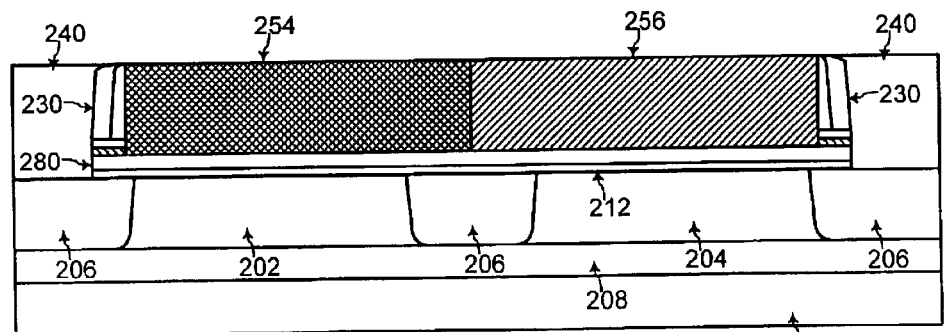

Further, FIG. 48 is substantially similar to FIG. 22, but in FIG. 48, the high-k gate dielectric material 280 is between the first oxide layer 212 and the nitride layer 214, after etching of the dummy gate structure 220 and the second oxide layer 216. Additionally, FIG. 49 is substantially similar to FIG. 23, but in FIG. 49, the high-k gate dielectric material 280 is already present on the first oxide layer 212, after etching of the nitride layer 214. After formation of the opening 242 in FIG. 49, the first metal 246 is deposited into such an opening 242, and the inter-diffused metal gate 254 and the first metal gate 256 are formed as illustrated in FIG. 50 and similarly as already described herein in reference to FIGS. 25–30.

In this embodiment of the present invention, the high-k gate dielectric material 280 forming the gate dielectrics for the complementary field effect transistors is deposited during deposition of the ONO layers 212, 214, and 216 even before formation of the opening 242. In this embodiment also, the high-k dielectric gate material 280 forming the gate dielectrics for both of the complementary field effect transistors is deposited in one deposition process. Thus, the gate dielectrics for both of the complementary field effect transistors advantageously have a same thickness for better control of the threshold voltage of such field effect transistors.

Note that this embodiment of depositing the high-k gate dielectric material 280 between the first oxide layer 212 and the nitride layer 214 during deposition of the ONO layers 212, 214, and 216 may also be combined with the embodiment of FIGS. 33–36, or with the embodiment of FIGS. 37–40, or with the embodiment of FIGS. 41–44, as would be apparent to one of ordinary skill in the art of integrated circuit fabrication from the description herein.

The foregoing is by way of example only and is not intended to be limiting. Any specified material or any specified dimension of any structure described herein is by way of example only. For example, the present invention may be practiced with the inter-diffused metal gate 254 and the first metal gate 256 switched in FIG. 30 such that the inter-diffused metal gate 254 is formed over the P-well 204 and the first metal gate 256 is formed over the N-well 202. Similarly, the present invention may be practiced with the metal silicide gate 266 and the first metal gate 264 switched in FIG. 40 such that the metal silicide gate 266 is formed over the N-well 202 and the first metal gate 264 is formed over the P-well 204. Furthermore, the present invention may be practiced with the implanted metal gate 275 and the first metal gate 273 switched in FIG. 44 such that the implanted metal gate 275 is formed over the N-well 202 and the first metal gate 273 is formed over the P-well 204.

In addition, as will be understood by those skilled in the art, the structures described herein may be made or used in the same way regardless of their position and orientation. Accordingly, it is to be understood that terms and phrases such as "on", "side", "beneath", and "top" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

We claim:

1. A method of fabricating dual gate structures of complementary transistors, including the steps of:
   depositing a first gate material into a single continuous opening disposed over a P-well and an N-well having the complementary transistors formed therein;
   forming a second gate material to contact a portion of the first gate material over one of the P-well or N-well; and
   forming a first gate structure from an interaction of the first and second gate materials in contact, and forming a second gate structure from the remaining first gate material,
   wherein the first and second gate structures are formed within the single contiguous opening.

2. The method of claim 1, further including the step of:
   forming a layer of gate dielectric material over the P-well and the N-well before deposition of the first gate material.

3. The method of claim 2, wherein the gate dielectric material is a high-k dielectric material.

4. The method of claim 1, further including the steps of:
   forming a dummy gate structure to be disposed over the P-well and the N-well;
   forming drain and source regions for the complementary transistors in the P-well and the N-well;
   forming a dielectric layer that surrounds the dummy gate structure with a top surface of the dummy gate structure exposed; and
   etching away the dummy gate structure to form the single opening disposed over the P-well and the N-well.

5. The method of claim 4, further including the steps of:
   forming a first layer of oxide on the N-well and the P-well, a layer of nitride on the first layer of oxide, and a second layer of oxide on the layer of nitride, before formation of the dummy gate structure on the second layer of oxide;
   wherein the second layer of oxide is etched away as the dummy gate structure is etched away;
   etching away the layer of nitride; and
   forming a high-k gate dielectric material on the first layer of oxide.

6. The method of claim 4, further including the steps of:
   forming a first layer of oxide on the N-well and the P-well, a high-k gate dielectric material on the first layer of oxide, a layer of nitride on the high-k gate dielectric material, and a second layer of oxide on the layer of nitride, before formation of the dummy gate structure on the second layer of oxide;
   wherein the second layer of oxide is etched away as the dummy gate structure is etched away; and
   etching away the layer of nitride to expose the high-k gate dielectric material.

7. The method of claim 1, further including the steps of:
   forming a self-aligning dielectric mask on a portion of the first gate material comprised of a first metal over one of the P-well or the N-well; and
   depositing the second gate material, comprised of a second metal different from the first metal, to contact the exposed portion of the first metal;
   wherein the first and second metals in contact inter-diffuse into each-other in a thermal anneal process to form the first gate structure.

8. The method of claim 7, wherein the first and second metals are each a respective one of tungsten, titanium, tantalum, titanium nitride, tantalum nitride, aluminum, copper, nickel, platinum, or palladium.

9. The method of claim 7, wherein at least one of the first and second gate materials is a metal alloy, a metal nitride, or a metal doped with a semiconductor element.

10. The method of claim 1, further including the step of:
    polishing the first gate material to be contained within the single opening after deposition of the first gate material.

11. The method of claim 1, wherein the first gate material is a metal, and the second gate material is a semiconductor material, such that the first gate structure is a metal silicide formed in a thermal anneal process.

12. The method of claim 11, wherein the first gate material is comprised of one of tungsten, titanium, tantalum, titanium nitride, tantalum nitride, aluminum, copper, nickel, platinum, palladium, a metal alloy, a metal nitride, or a metal doped with a semiconductor element.

13. The method of claim 11, wherein the semiconductor material is amorphous silicon.

14. The method of claim 1, wherein the first gate material substantially fills the single opening from the step of depositing the first gate material.

15. The method of claim 14, wherein the second gate material is formed to contact the portion of the first gate material after the first gate material is deposited to substantially fill the single opening.

16. The method of claim 14, further including the steps of:
    forming a self-aligning dielectric mask on a portion of the first gate material comprised of a first metal over one of the P-well or the N-well; and
    depositing the second gate material, comprised of a second metal different from the first metal, to contact the exposed portion of the first metal;
    wherein the first and second metals in contact inter-diffuse into each-other in a thermal anneal process to form the first gate structure.

17. The method of claim 16, wherein the first and second metals are each a respective one of tungsten, titanium, tantalum, titanium nitride, tantalum nitride, aluminum, copper, nickel, platinum, or palladium.

18. The method of claim 16, wherein at least one of the first and second gate materials is a metal alloy, a metal nitride, or a metal doped with a semiconductor element.

19. The method of claim 14, further including the step of:
polishing the first gate material to be contained within the single opening after deposition of the first gate material.

20. The method of claim 14, wherein the first gate material is a metal, and the second gate material is a semiconductor material, such that the first gate structure is a metal silicide formed in a thermal anneal process.

21. The method of claim 20, wherein the first gate material is comprised of one of tungsten, titanium, tantalum, titanium nitride, tantalum nitride, aluminum, copper, nickel, platinum, palladium, a metal alloy, a metal nitride, or a metal doped with a semiconductor element.

22. The method of claim 20, wherein the semiconductor material is amorphous silicon.

* * * * *